(12) United States Patent
Saito et al.

(10) Patent No.: US 8,188,521 B2
(45) Date of Patent: May 29, 2012

(54) POWER SEMICONDUCTOR DEVICE

(75) Inventors: Wataru Saito, Kanagawa-ken (JP);
Syotaro Ono, Kanagawa-ken (JP);
Munehisa Yabuzaki, Kanagawa-ken (JP); Nana Hatano, Kanagawa-ken (JP);
Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/728,823

(22) Filed: Mar. 22, 2010

(65) Prior Publication Data
US 2010/0308399 A1 Dec. 9, 2010

(30) Foreign Application Priority Data

Jun. 9, 2009 (JP) .................................. 2009-138270
Feb. 16, 2010 (JP) .................................. 2010-031023

(51) Int. Cl.
*H01L 29/739* (2006.01)
*H01L 29/78* (2006.01)
*H01L 29/08* (2006.01)

(52) U.S. Cl. . 257/288; 257/328; 257/409; 257/E29.005; 257/E29.008; 257/E29.012

(58) Field of Classification Search .................. 257/288, 257/328, 409, E29.005, E29.008, E29.012
See application file for complete search history.

(56) References Cited

U.S. PATENT DOCUMENTS

| 6,066,878 | A | 5/2000 | Neilson | |
|---|---|---|---|---|
| 6,081,009 | A | 6/2000 | Neilson | |
| 6,586,801 | B2 * | 7/2003 | Onishi et al. | 257/339 |
| 6,674,126 | B2 * | 1/2004 | Iwamoto et al. | 257/341 |
| 6,696,728 | B2 * | 2/2004 | Onishi et al. | 257/341 |
| 6,724,042 | B2 * | 4/2004 | Onishi et al. | 257/341 |
| 6,821,824 | B2 * | 11/2004 | Minato et al. | 438/138 |
| 6,888,195 | B2 * | 5/2005 | Saito et al. | 257/328 |
| 6,903,418 | B2 * | 6/2005 | Iwamoto et al. | 257/342 |
| 7,535,059 | B2 * | 5/2009 | Yoshikawa et al. | 257/341 |
| 2002/0167020 | A1 | 11/2002 | Iwamoto | |
| 2007/0272977 | A1 | 11/2007 | Saito et al. | |
| 2007/0272979 | A1 | 11/2007 | Saito et al. | |
| 2008/0246085 | A1 | 10/2008 | Saito et al. | |

FOREIGN PATENT DOCUMENTS

| JP | 11-233759 A | 8/1999 |
|---|---|---|
| JP | 2008-258327 A | 10/2008 |

* cited by examiner

*Primary Examiner* — Evan Pert
(74) *Attorney, Agent, or Firm* — Patterson & Sheridan, LLP

(57) ABSTRACT

A power semiconductor device has semiconductor layers, including: first layer of first type; second and third layers respectively of first and second types alternately on the first layer; fourth layers of second type on the third layers; fifth layers of first type on the fourth layer; sixth and seventh layers respectively of second and first types alternately on the second and third layers; a first electrode connected to the first layer; an insulation film on fourth, sixth, and seventh layers; a second electrode on fourth, sixth, and seventh layers via the insulation film; and a third electrode joined to fourth and fifth layers, wherein the sixth layers are connected to the fourth layers and one of the third layers between two fourth layers, and an impurity concentration of the third layers below the sixth layers is higher than that of the third layers under the fourth layers.

20 Claims, 22 Drawing Sheets a > b

POWER SEMICONDUCTOR DEVICE

CROSS-REFERENCE TO RELATED APPLICATIONS

This application is based upon and claims the benefit of priority from the prior Japanese Patent Application No. 2009-138270, filed on Jun. 9, 2009 and the prior Japanese Patent Application No. 2010-031023, filed on Feb. 16, 2010; the entire contents of which are incorporated herein by reference.

BACKGROUND

Field

Embodiments of the invention relate generally to a power semiconductor device.

For power semiconductor devices, it is desirable that their power consumption is low. For example, the power consumption of, e.g., the power MOSFET, which is one of the power semiconductor devices, largely depends on the electric resistance of the drift layer, which contributes mainly to the ON-resistance. The impurity dose which determines the electric resistance of the drift layer cannot be increased corresponding to the breakdown voltage of the p-n junction formed between the p-type base layer and the n-type drift layer to be above a limit. Accordingly, the device breakdown voltage and the ON resistance have trade-off with each other, and designs of devices have been optimized in consideration of this trade-off relationship. On the other hand, this trade-off relationship depends on materials and structures of the devices and has intrinsic limitations. The advanced technology overcoming these limitations leads to new devices that are superior to the existing power semiconductor devices.

For example, as a power semiconductor device having the above-described trade-off much improved is known a MOSFET of the SJ structure (Super Junction structure) having a p-pillar layer and an n-pillar layer periodically buried in a drift layer. The SJ structure realizes low ON resistance which approaches the material limit by making the charge quantity (impurity dose) of the p-pillar layers and that of the n-pillar layers equal to each other to simulate a non-doped layer to thereby retain high breakdown voltage and further flowing current through a heavily doped n-pillar layer.

The use of such SJ structure can realize devices that overcome the conventional trade-off between the ON resistance and the voltage resistance. However, in the SJ structure, to decrease the ON resistance, it is necessary to increase the dose of an impurity to be implanted in the n-pillar layers and simultaneously to increase an impurity of the p-pillar layers to thereby decrease the periodic width in transverse direction of the SJ structure. When the impurity does of the p-pillar layers and the n-pillar layers are increased without decreasing the transverse periodic width, the transverse electric field that completely depletes the SJ structure becomes higher than the longitudinal electric field, whereby avalanche breakdown takes place in the transverse direction. Resultantly, before the SJ structure is completely depleted, hole current generated by the avalanche breakdown is injected into the base layer of the MOSFET, and parasitic transistors are turned on, and lowers the voltage resistance of the p-n junction formed by the base layer and drift layer. That is, to decrease the ON resistance with the high voltage resistance of the SJ structure retained, it is essential to decrease the transverse periodic width (e.g., Patent Reference 1). However, decreasing the transverse periodic width causes a problem in the process manufacturing the SJ structure and devices to be formed thereon.

Patent Reference 2 describes the structure combining the super junction structure and the terrace gate structure to thereby partially increase the pillar concentration. This can decrease the ON resistance while high breakdown voltage is retained. However, this structure adds spreading resistance immediately below the terrace gate, which restricts the decrease of the ON resistance.

SUMMARY

According to an aspect of the invention, there is provided a power semiconductor device including a first semiconductor layer of a first conduction type (i.e. a first conductivity type); second semiconductor layers of the first conduction type and third semiconductor layers of a second conduction type (i.e. a second conductivity type) alternately provided transversely on the first semiconductor layer; fourth semiconductor layers of the second conduction type provided on the surfaces of the third semiconductor layers; fifth semiconductor layers of the first conduction type provided selectively on the surfaces of the fourth semiconductor layer; sixth semiconductor layers of the second conduction type and seventh semiconductor layers of the first conduction type alternately provided transversely on the second and the third semiconductor layers; a first main electrode electrically connected to the first semiconductor layer; an insulation film provided on the fourth semiconductor layers, the sixth semiconductor layers and the seventh semiconductor layers; a control electrode provided on the fourth semiconductor layers, the sixth semiconductor layers and the seventh semiconductor layers via the insulation film; and a second main electrode joined to the surfaces of the fourth semiconductor layers and the fifth semiconductor layers, the sixth semiconductor layers being connected to the fourth semiconductor layers and to at least one of the third semiconductor layers, which is provided between two of the fourth semiconductor layers, and an impurity concentration of the third semiconductor layers provided below the sixth semiconductor layers being higher than an impurity concentration of the third semiconductor layers provided under the fourth semiconductor layers.

DETAILED DESCRIPTION

Figure 1:
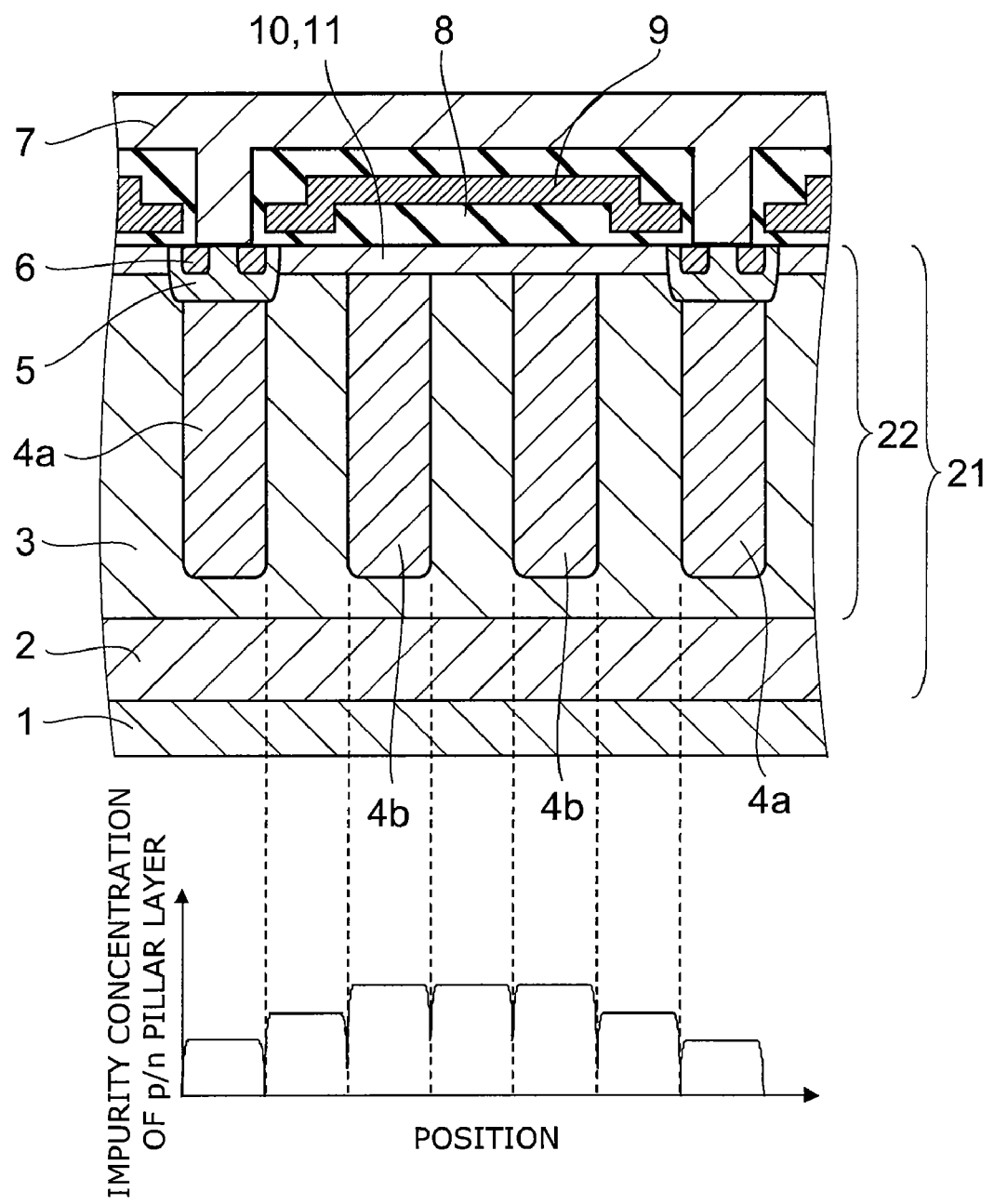
FIG. 1 is a cross-sectional view of the unit cell of the power semiconductor device according to a first embodiment of this invention, and the impurity concentration distribution of the respective pillar layers.

Embodiments of this invention will be described below with reference to the drawings. In the following description, a power MOSFET, which is one of the power semiconductor devices, will be exemplified. In the drawings, the same reference numbers represents the same members. The first conduction type is n-type, and the second conduction type is p-type.

A First Embodiment

FIG. 1 is a cross-sectional view of the unit cell of the power MOSFET according to a first embodiment of this invention.

The MOSFET according to this embodiment uses a semiconductor substrate 21 including an $n^+$-drain layer 2 which is the first semiconductor layer, n-pillar layers 3 which are the second semiconductor layer provided on the $n^+$-drain layer 2, and p-pillar layers 4a, 4b which are the third semiconductor layers and are disposed alternately with the n-pillar layer 3.

On the surface of the semiconductor substrate 2, p-base layers 5 which are the fourth semiconductor layer connected to the p-pillars 4a are provided. On the surface of the p-base layers 5, n-source layers 6 which are the fifth semiconductor layer are provided. Furthermore, surface p-pillar layers 10 which are the sixth semiconductor layers connected to a plurality of the p-base layers 5, surface n-pillar layers 11 which are the seventh semiconductor layers arranged alternately with the surface p-pillar layers 10 are provided on the surface of the semiconductor substrate 21.

Furthermore, an insulation film is formed on the semiconductor substrate and functions as a gate insulation film 8 which insulates a gate electrode 9, which is a control electrode, from the p-base layers 5, the surface p-pillar layers 10 and the surface n-pillar layers 11.

On the other hand, on the underside of the semiconductor substrate 21, a drain electrode 1 which is the first main electrode electrically connected to the n+-drain layer 2 is formed. On the surface of the semiconductor substrate 21, a source electrode 7, which is the second main electrode, joined to the surfaces of the p-base layers 7 and the n-source layers 6 is provided.

The p-pillar layers 4b are connected to the p-base layer 5 via the surface p-pillar layers 10. The p-pillar layers 4b connected to the surface p-pillar layers 10 has a higher impurity concentration than the p-pillar layers 4a directly connected to the p-base layers 5. The gate insulation film 8 on the p-pillar layers 4b provided below the surface p-pillar layers 10 is thicker than the gate insulation film on the p-base layers 5.

The semiconductor substrate 1 used in manufacturing the power MOSFET illustrated in FIG. 1 can be an epitaxial substrate comprising, e.g., an $n^+$-silicon substrate as the $n^+$-drain layer 2, and a super junction layer 22 formed thereon. The super junction layer 22 can include a multi-layer stacked by repeating epitaxial growth plural times, and into the regions of the respective grown layers, which are to be the n-pillar layers 3 and the p-pillar layers 4a, 4b, an n-type impurity and a p-type impurity are ion implanted. The dose of the n-type impurity of the n-pillar layers 3 and the dose of the p-impurity for the ion implantation are adjusted to be equal to each other. As illustrated, the n-pillar layers 3 and the p-pillar layers 4a, 4b are alternately arranged in the super junction layer 22 provided on the $n^+$-drain layer 2.

The p-base layers 5 provided on the semiconductor substrate 21 are periodically arranged and disposed at the both ends of the gate electrode 9. The unit cell of the power MOSFET that means unit period is included in the cross-section shown in FIG. 1. In the power MOSFET according to this embodiment, the n-pillar layer 3, the p-pillar layers 4a, 4b, the p-base layers 5 and the n-source layers 6 are formed in stripes in the depth direction as viewed in the drawing (see FIG. 2).

Above the region from one p-base layer to the other opposed p-base layer 5 via a plurality of the n-pillar layers 3 and a plurality of the p-pillar layers 4b, the gate electrode 9 is formed with the gate insulation film 8 formed therebetween. For example, the gate insulation film 8 is Si oxide film. Between the two p-based layers 5 opposed to each other, the surface p-pillar layers 10 are formed in contact with the respective p-base layers 5, and as illustrated, the two p-pillar layers 4b, which are not in contact with the p-base layers 5, are in contact with the surface p-pillar layers 10.

The gate insulation film 8 of this embodiment at the middle portion of the gate electrode 9 is thicker than the gate insulation film 8 at the ends above the p-base layers 5. That is, the film thickness of the gate insulation film above the p-base layers 5 is provided to be thin so that the gate threshold voltage has a value in a prescribed range. For example, to make the gate threshold voltage about 4 V, the gate insulation film is formed in an about 0.1 μm of the thickness. On the other hand, the middle portion of the gate electrode, which does not affect on the gate threshold voltage, can be as thick as, e.g., 1~1.5 μm.

When high voltage is applied to the drain electrode 1, high voltage is applied between the source electrode 7 and the drain electrode 1, and also applied between the gate electrode 9 and the drain electrode 1. At the middle portion of the gate electrode 9, both the gate insulation film 8 and the SJ structure retain the voltage. Accordingly, the breakdown voltage of the gate insulation film 8 is raised by making the gate insulation film 8 thick, and the retained voltage of the SJ structure can be made lower. That is, the impurity concentrations of the respective pillar layers disposed in the SJ structure can be raised to thereby make the ON resistance lower.

On the other hand, the voltage retained by the SJ structure immediately below the p-based layers 5, i.e., by the p-pillar layers 4a connected to the p-base layers 5 and the n-pillars 3 adjacent thereto is not influenced by the thickness of the gate insulation film 8. That is, to maintain the device breakdown voltage, the impurity concentration of the pillar layers 4a below the p-based layers 5 cannot be raised. Then, as shown by the impurity concentration distribution in the drawing, the impurity concentrations of the respective pillar layers can be set higher at the middle portion of the gate electrode 9 and lower below the p-base layers 5. Thus, the concentrations of all the pillars cannot be uniformly raised, but the impurity concentration of the pillar layers below the middle portion of the gate electrode 9 and the impurity concentration of the n-pillar layers 3 adjacent thereto are raised, whereby the ON resistance of the entire device can be decreased.

For example, when a device having the breakdown voltage of a 600 V is designed, the thick portion of the gate insulation film 8 can be 1.5 μm, the retained voltage of the insulation film can be 300 V, and the retained voltage of the SJ structure therebelow can be 300 V. This makes the retained voltage a half that of the SJ structure below the p-base layers 5, whereby the impurity concentration of the respective pillar layers 4b can be increased about twice that of the pillar 4a below the p-base layers 5. Resultantly, the impurity concentration of the n-pillar layers 3 adjacent to the respective pillar layers 4b is also raised so that the pillar layers of the high impurity concentration occupy a half of the whole, whereby the ON resistance can be decreased by about 25%.

To obtain the above-described effect, it is easy to make the gate insulation film 8 thicker. Furthermore, in the process of repeating ion implantation and burying growth to form the SJ structure, the mask width for the ion implantation is partially varied, whereby doses of impurities to be doped can be changed, and the impurity concentration distribution of the respective pillar layers illustrated in FIG. 1 can be obtained. That is, only by varying the mask pattern for the ion implantation, the power MOSFET according to this embodiment can be easily fabricated, and the ON resistance can be drastically decreased.

Figure 2A:
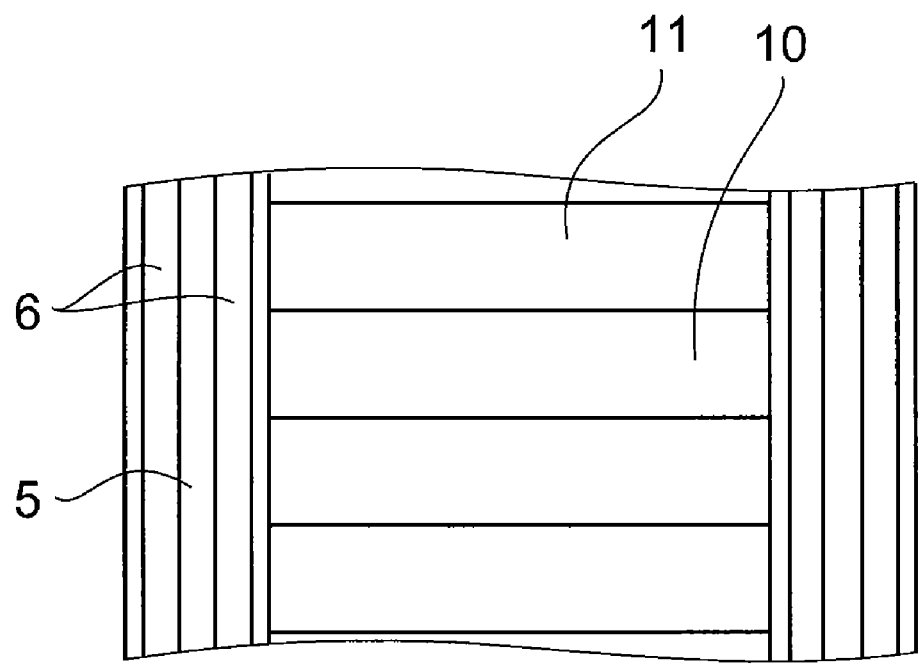
FIGS. 2A and 2B are a schematic view of the plan arrangement of the semiconductor layers forming the power semiconductor device according to the first embodiment of this invention.
Figure 2B:
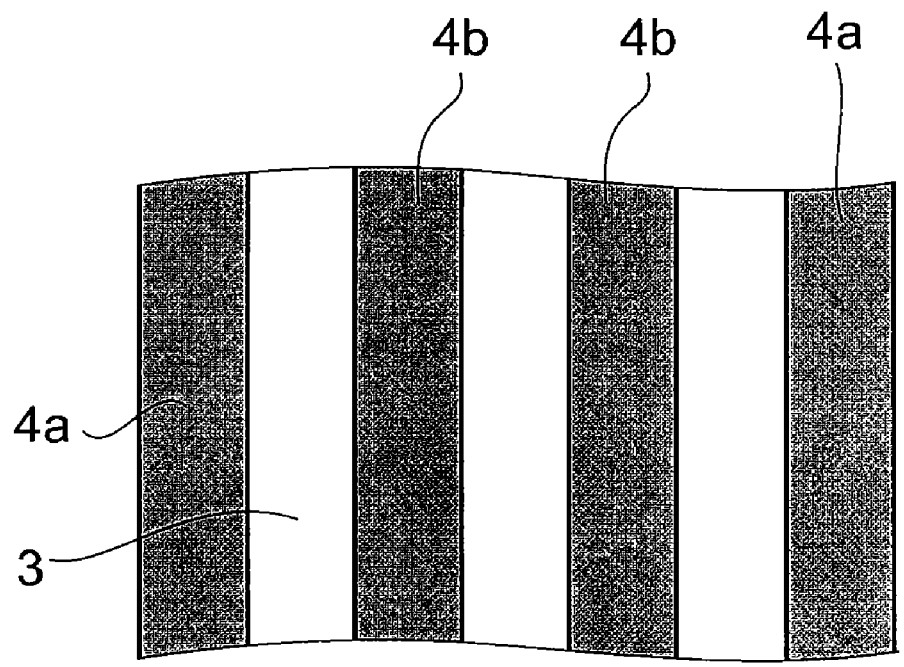

FIGS. 2A and 2B are a schematic view of the plan arrangement of the respective semiconductor layers of the power MOSFET according to the first embodiment described above. FIG. 2A is a schematic view of the layout of the surface p-pillar layers 10, the surface n-pillar layers 11, the p-based layers 5 and the n-source layers 6. FIG. 2B illustrates the layout of the p-pillar layers 4a, 4b and the n-pillar layers 3. As described above, the p-pillar layers 4a, 4b and the n-pillar layers 3 are formed in stripes. The p-base layers 5 formed connected to the p-pillar layers 4a are also formed in stripes along the p-pillar layers 4a.

Below the gate electrode 9 (not illustrated in FIG. 2A or 2B) disposed between the p-base layers which are periodically formed, the surface p-pillar layers 10 and the surface n-pillar layers 11 are formed with the gate insulation film 8 formed between the gate electrode and the surface p-pillar and n-pillar layers. As illustrated in FIG. 2A, the surface p-pillar layers 10 and the surface n-pillar layers 11 are formed orthogonally to the p-base layers 5 and are alternately arranged. The surface p-pillar layers 10 and the surface n-pillar layers 11 are arranged orthogonal also to the p-pillar layers 4a, 4b and the n-pillar layers 3.

When a voltage is applied to the gate electrode 9, MOS gate channels are formed in both ends of the p-base layers 5 (see FIG. 1) current spreads from the n-source layers 6 to the n-pillar layers 3 via the MOS gate channels and the surface n-pillar layers 11, whereby the current flows into the entire n-pillar layers 3 of the SJ structure. That is, to decrease the ON resistance, the surface n-pillar layers 11, which are to be the current paths are preferably provided to have low resistivity. Accordingly, preferably, the surface n-pillar layers 11 have a higher impurity concentration than the n-pillar layers 3.

When a somewhat high voltage is applied between the drain electrode 1 and the source electrode 7, the SJ structure is completely depleted and holes are charged and discharged between the source electrode 7 and the p-pillar layers 4a, 4b. To make this charge and discharge quicker, the p-pillar layers 4a, 4b be preferably connected to any one of the p-base layers 5. In the configuration of this embodiment, the p-pillar layers 4b, which are not directly connected to the p-base layers 5, can be connected to the p-base layers by the surface p-pillar layers 10. Hence, when the power MOSFET is on switching, holes can be charged and discharged through the surface p-pillar layers 10.

On the other hand, when the all p-pillar layers 4a and 4b are connected to the p-base layers 5, the capacitance of the p-n junction between all the p-pillar layers 4a, 4b and the n-pillar layers contributes to the drain-source capacitance Cds. Then, the drain-source capacitance Cds decreases as the voltage Vds applied between the drain electrode 1 and the source electrode increases. The large change rate of the Cds-Vds characteristics makes the change rate of the drain voltage (ΔVds/Δt) larger and the switching noise higher.

For example, when the p-pillar layers 4b, which are not directly connected to the p-base layers 5, are connected to the p-base layers 5 by the surface p-pillar layers 10 of a high concentration, the surface p-pillar layers 10 are not easily depleted, and corresponding to an applied voltage, the depletion of all the p-pillar layers 4a, 4b and the n-pillar layers 3 simultaneously goes on, and the Cds abruptly lowers. Thus, the change rate of the Cds-Vds characteristics becomes high, which causes the problem that the switching noise tends to generate.

In contrast to this, before the SJ structure of the drift layer is completely depleted by the voltage Vds applied between the drain electrode 1 and the source electrode 7, the surface p-pillar layers 10 are depleted, and the p-pillar layers 4b are not easily depleted, whereby the switching noise can be decreased. That is, when the surface p-pillar layers 10 are depleted to thereby disconnect the p-base layers 5 and the p-pillar layers 4b from each other, the depletion of the p-pillar layers 4b stops, and the depletion of only the p-pillar layers 4a connected directly to the p-base layers 5 goes on. Then, as the Vds is further increased, the depletion of the p-pillar layers 4b nearer to the p-base layers 5 and the adjacent n-pillar layers 3 sequentially goes on. This operation makes the change rate of the Cds-Vds characteristics small, and the switching noise can be lower.

Figure 3A:
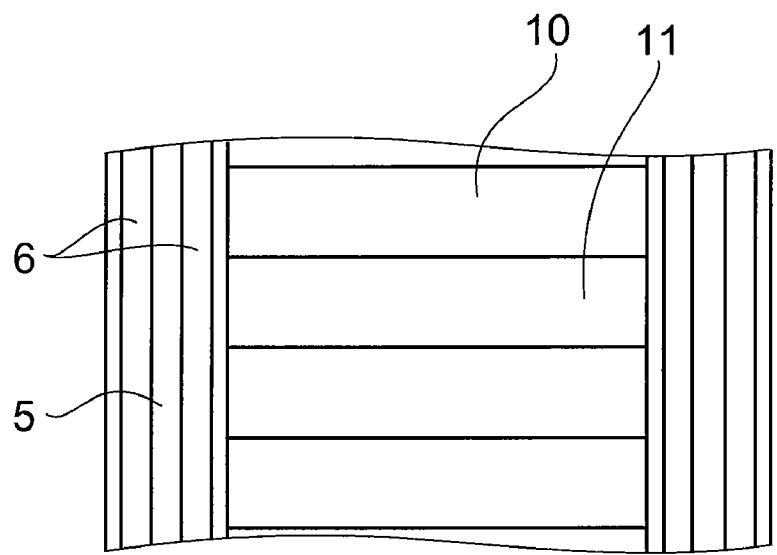
FIGS. 3A and 3B are a schematic view of the plan arrangement of the semiconductor layers forming the power semiconductor device according to the first embodiment of this invention, and the impurity concentration distributions of the surface p-pillar layers and the surface n-pillar layers.

To obtain the effect of decreasing the switching noise described above, the surface-pillar layers 10 are preferably depleted with a relatively low voltage. To this end, the impurity concentration of the surface p-pillar layers 10 can be lower in the portions connected to the p-pillar layers 4b than in the portions connected to the p-base layers 5. For example, as illustrated in FIG. 3A, it is effective that the impurity concentration of the surface p-pillar layers 1 has a profile which lowers toward the region corresponding to the middle portion of the gate electrode 9. The surface p-pillar layers 4b has such concentration profile, whereby corresponding to increases of the voltage Vds applied between the drain electrode 1 and the source electrode 7, the surface p-pillar layer 10 starts to be depleted gradually first in the portions of a lower concentration and has no connection with the p-base layers 5. This makes variations of the Cds-Vds characteristics small, whereby the switching noise can be further decreased.

Figure 3A:
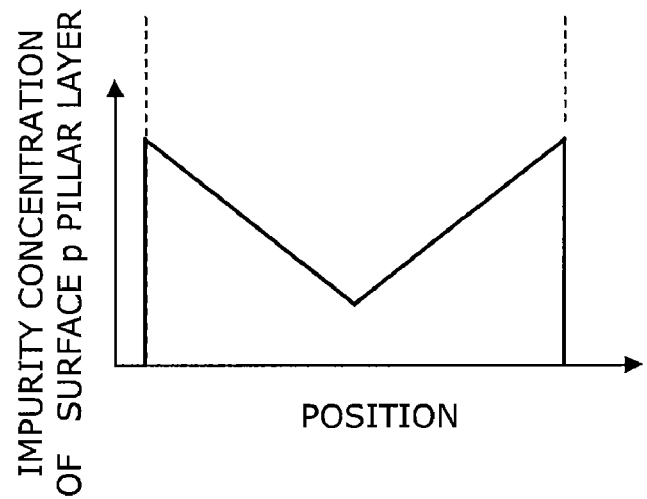
Figure 3B:
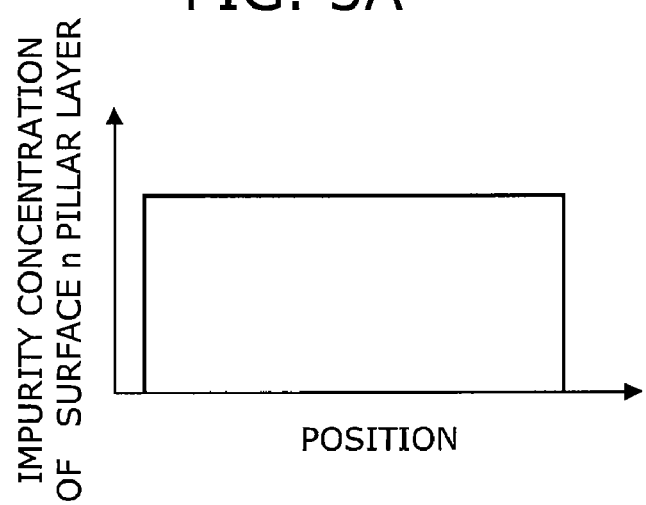

At this time, the impurity concentration of the surface n-pillar layers 11 can be made uniform among the adjacent surface n-pillar layers 11 as illustrated in FIG. 3B. In this case, the impurity concentration of the surface p-pillar layers 10 can be made higher in the portions connected to the p-base layers 5 than the impurity concentration of the surface n-pillar layers 11. ON the other hand, immediately below the middle part of the gate electrode 9 disposed between the p-base layers 5, i.e., in the middle part illustrated in FIG. 3A, the impurity concentration of the surface n-pillar layers 11 can be made higher than the impurity concentration of the surface p-pillar layers 10. This permits the depletion region to expand gradually from the middle portion of the surface p-pillar layer 10 having the low impurity concentration toward the p-base layers 5.

Unless the impurity concentration of the surface n-pillar layers 11 is made uniform, as is uniform in FIG. 3B, the same effect can be obtained when the impurity concentration of the surface n-pillar layers 11 is higher than the impurity concentration of the surface p-pillar layers 10 immediately below the middle portion of the gate electrode 9. That is, the impurity concentration of the surface n-pillar layers 11 can be varied between the p-base layers 5. For example, the surface n-pillar layers 11 can have an impurity concentration profile which is higher immediately below the middle portion of the gate electrode 9 than the portions nearer to the p-base layers 5.

Figure 4A:
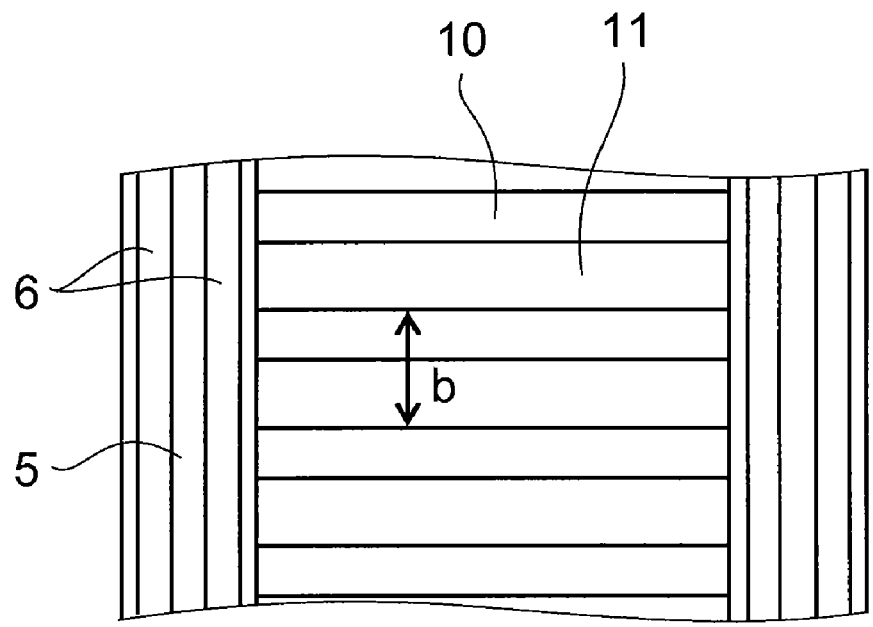
FIGS. 4A and 4B are a schematic view of the plan arrangement of the semiconductor layers forming the power semiconductor device according to the first embodiment of this invention.
Figure 4B:
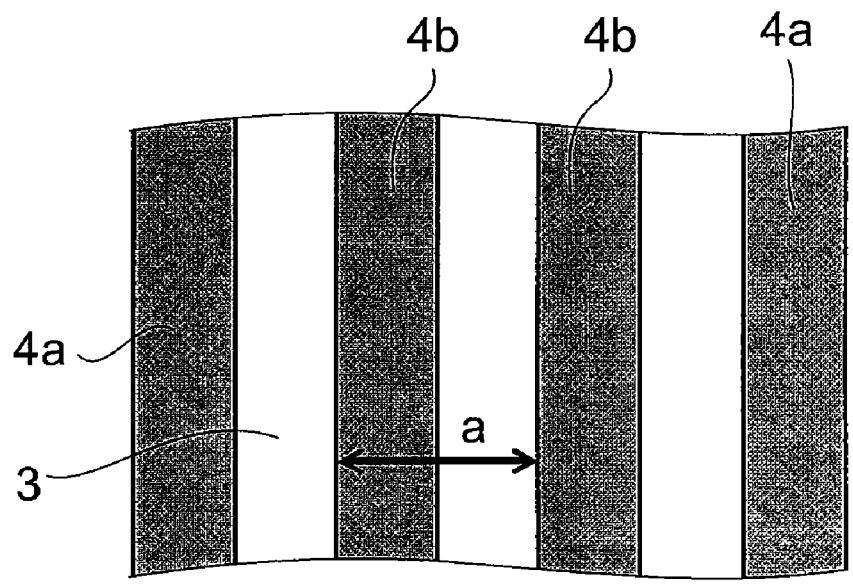

Furthermore, besides forming the impurity concentration profile of the surface p-pillar layers 10 as illustrated in FIG. 3A, preferably, the periodic width b of periodically arrangement of the surface p-pillar layers 10 and the surface n-pillar layers 11 as illustrated in FIG. 4A can be smaller than the periodic width "a" of the n-pillar layers 3 and the p-pillar layers 4a, 4b seen in FIG. 4B. As illustrated, decreasing the width of the surface p-pillar layers 10 can advance the depletion of the surface p-pillar layers 10 at the middle portions with lower voltages. Thus, the change rate of the Cds-Vds characteristics can be made less, and the switching noise can be surely lowered.

This embodiment described above has a merit that the larger current density operation may be accomplished by making the maximum drain current larger. That is, the surface p-pillar layers 10 are depleted also in the ON state as well as in the OFF state, whereby paths for holes to transit from the p-pillar layers 4b to the p-base layers 5 are absent. This suppresses the extension f the depletion layers from the p-pillar layers 4b to the n-pillar layers 3, the current channel in the n-pillar layers 3 are retained, and the drain current is not easily saturated. This increases the maximum drain current, and the large current density operation can be possible.

Figure 5:
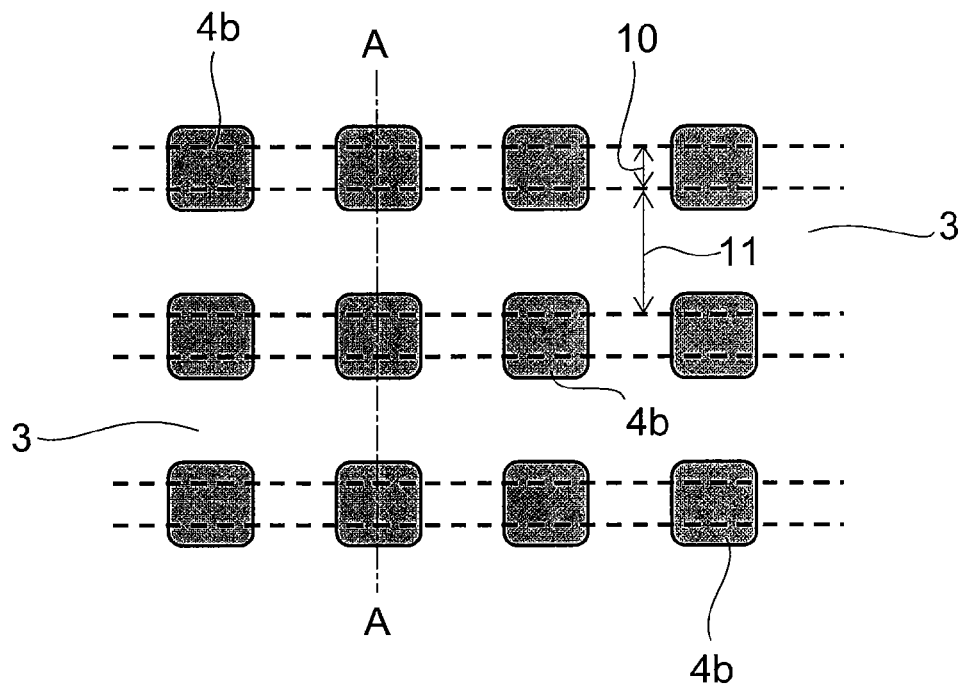
FIGS. 5 and 6 is a schematic view of the plan arrangement of the semiconductor layers forming the power semiconductor device according to variations of the first embodiment of this invention.
Figure 6:
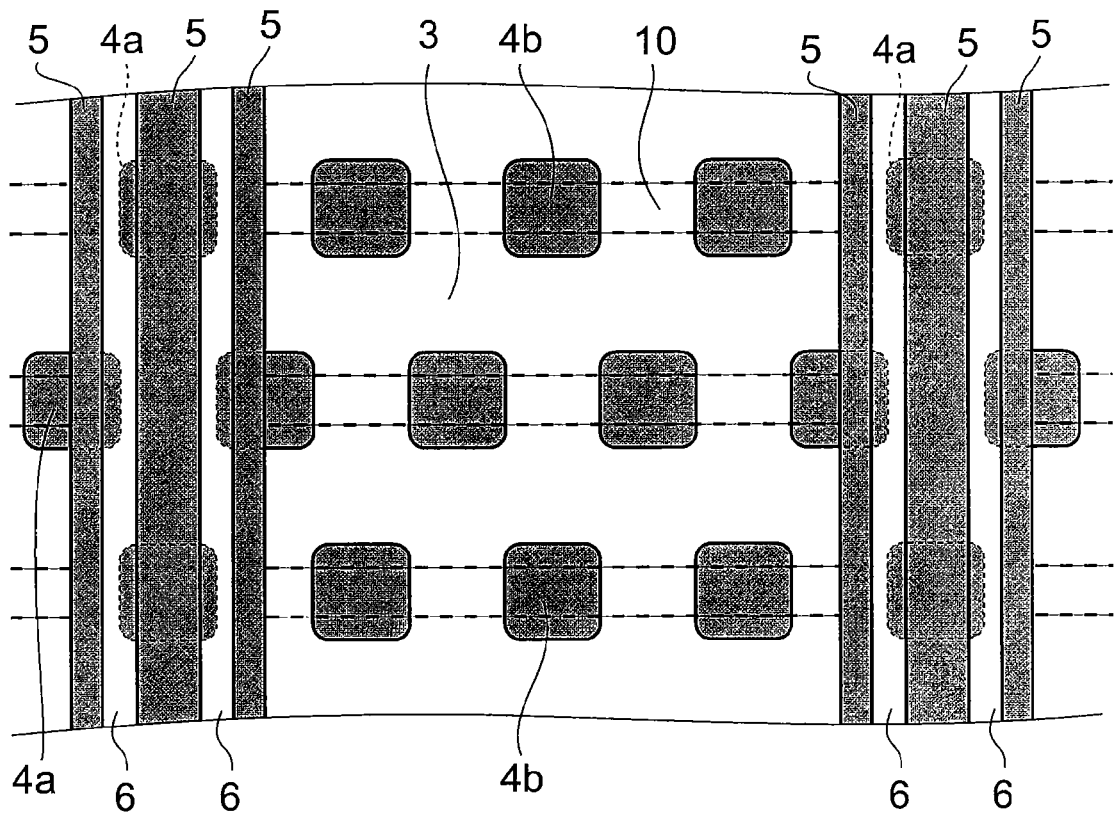
Figure 7:
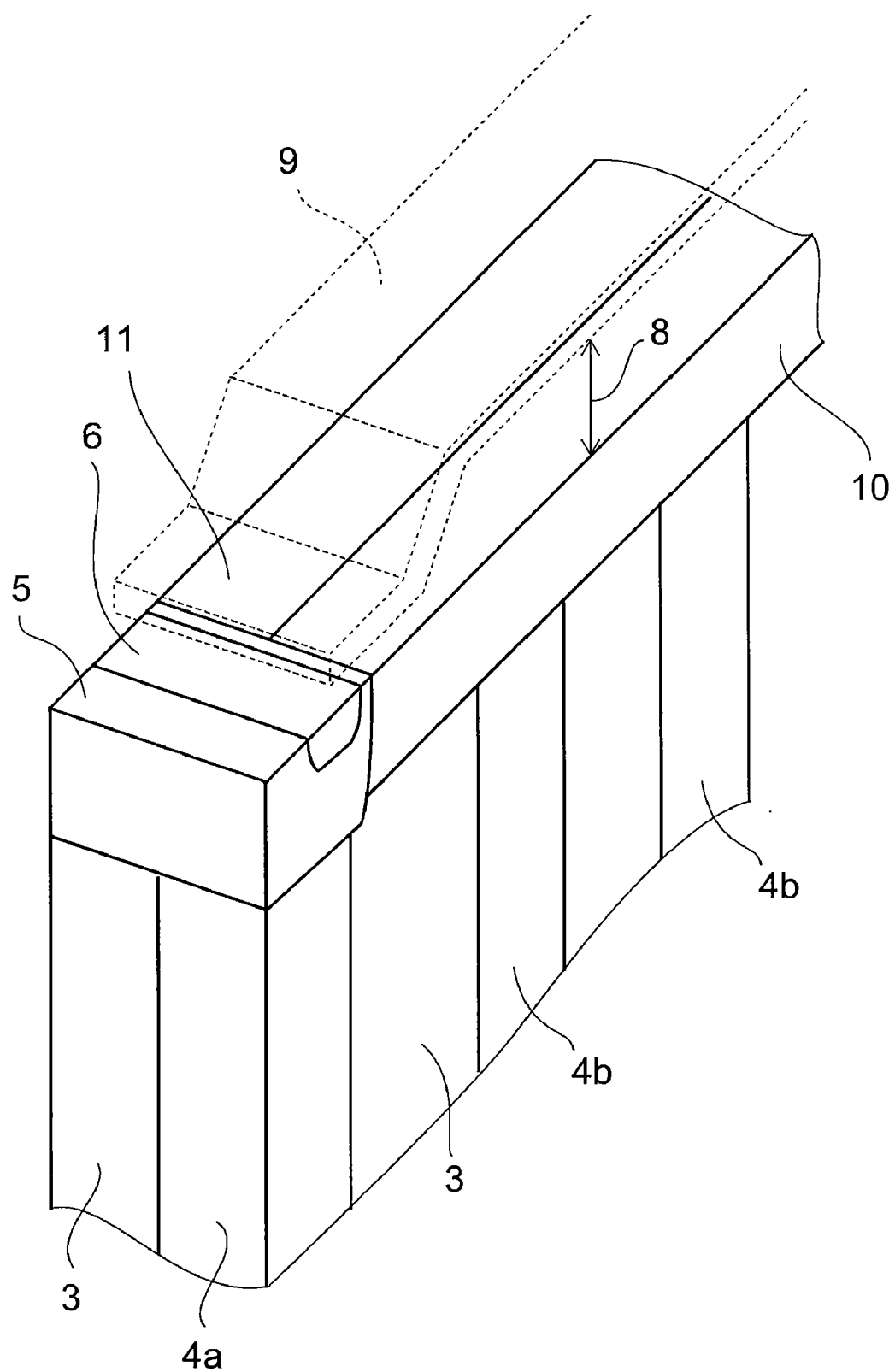
FIG. 7 is a perspective view schematically illustrating the configuration of the unit cell of the power semiconductor device according to variations of the first embodiment of this invention.

FIGS. 5 to 7 are schematic views of the power MOSFET according to variations of the first embodiment. In the above-described embodiment, the power MOSFET includes the n-pillar layers 3 and the p-pillar layers 4a, 4b formed in stripes. However, the pillar layers may not be stripe-shaped, and the power MOSFET including the p-pillar layers arranged in a mesh or an offset mesh as illustrated in FIGS. 5 and 6 can embody this invention.

For example, FIG. 5 the surface p-pillar layers 10 and the surface n-pillar layers 11 are alternately arranged in stripes for the n-pillar layers 3 and the p-pillar layers 4b arranged in a mesh. The surface p-pillar layers 10 are connected to the p-pillar layers 4b and are connected to the p-base layers 5, which are not illustrated (see FIG. 7).

This invention including the n-pillar layers 3 and the p-pillar layers 4b arranged in an offset mesh as illustrated in FIG. 6 can be embodied. As illustrated in FIG. 6, the surface p-pillar layers 10 and the surface n-pillar layers 11 are alternately arranged in stripes, and the surface p-pillar layers 10 are formed connected to the p-pillar layers 4b. The surface p-pillar layers 10 are connected to the p-base layers 5 provided in stripes. The p-base layers 5 are provided orthogonally to the surface p-pillar layers 10 and the surface n-pillar layers 11 and are connected to a plurality of the p-pillar layers 4a. The gate electrode, which is not illustrated in FIG. 6, is provided on the insulation film 8 between the respective p-base layers 5.

FIG. 7 is a perspective view schematically illustrating the configuration of the unit cell of the power MOSFET according to variations of the first embodiment. As illustrated in FIG. 5, the surface p-pillar layers 10 and the surface n-pillar layers 11 are alternately arranged on the n-pillar layers 3 and the p-pillar layers 4a, 4b arranged in a mesh. The surface p-pillar layers 10 are formed, electrically connecting the p-base layers 5 and the p-pillar layers 4b formed in stripes. Above the ends of the p-base layers 5, the surface p-pillar layers 10 and the surface n-pillar layers 11, the gate electrode 9 is formed with the insulation film formed therebetween. With the n-pillar layers 3 and the p-pillar layers 4b arranged in an offset mesh as illustrated in FIG. 6, it is obvious that the configuration is similar to the configuration illustrated in FIG. 7.

In the variations described above, the surface p-pillar layers 10 and the surface n-pillar layers 11 are formed in a periodic arrangement of stripes. However, because the same effect can be obtained as long as the p-pillar layers 4b are connected to the p-base layers 5 via the surface p-pillar layers 10 and are depleted by application of a voltage, the plane pattern of the surface p-pillars 10 is not limited to stripes and can have plane patterns other than matrix. Following this, the gate electrode can have patterns other than mesh, offset mesh, etc.

When the surface n-pillar layers 11, which are relatively heavily doped with an impurity, are formed at a position deeper that the p-base layers 5, there is a problem that the curved portions of the ends of the p-base layers 5 contact with the surface n-pillars 11, and electric field concentration takes place in the ends of the p-base layers 5. Accordingly, it is preferable that the surface n-pillar layers 11 are formed at a position shallower from the surface of the semiconductor substrate 21 than the p-base layers 5. This can prevent the breakdown voltage decrease, and furthermore, and the electric field in the interface with the gate insulation film becomes small, whereby the gate leak increase and variation of the gate threshold voltage can be suppressed, and high reliability can be obtained.

Figure 8:
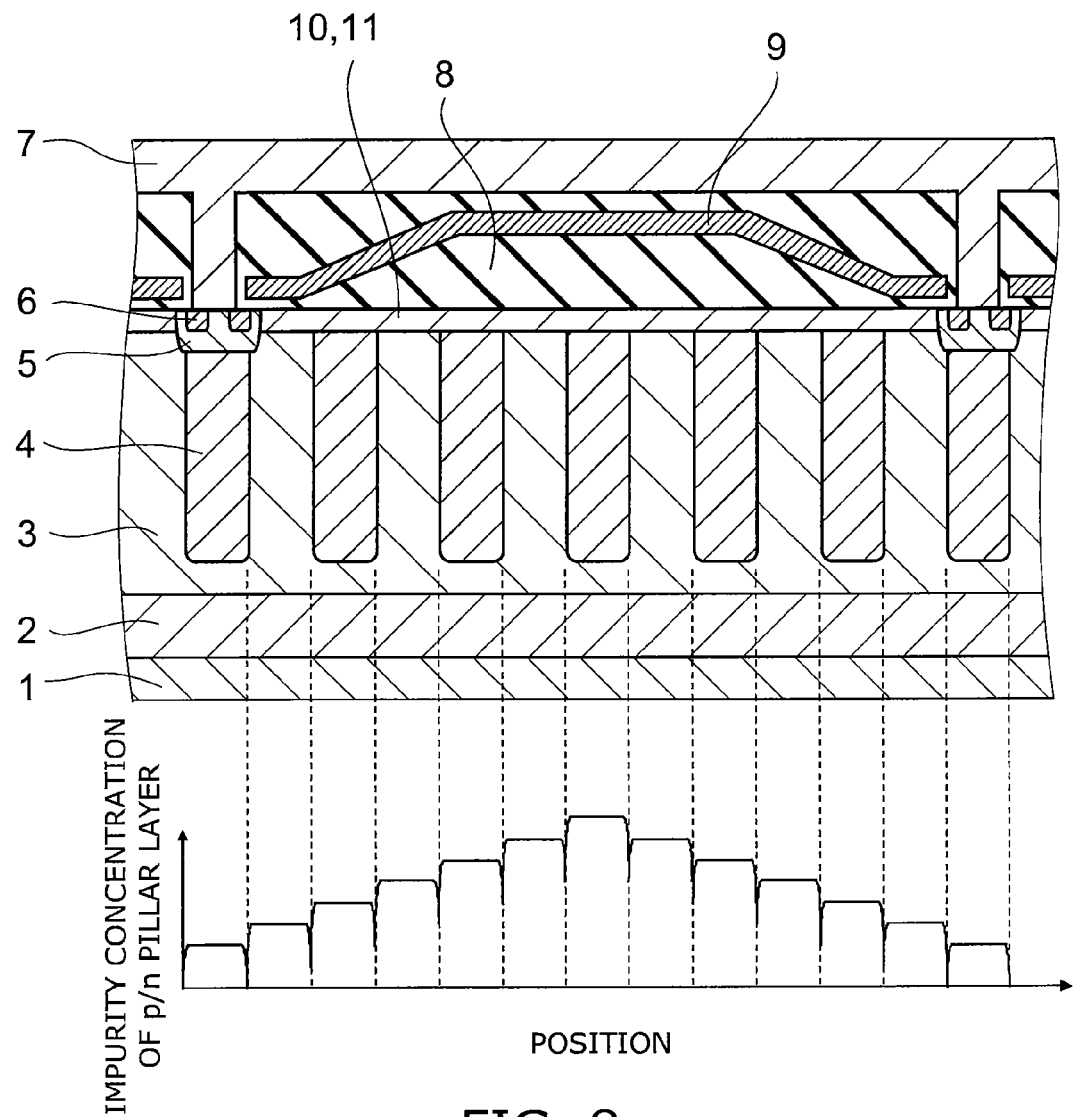
FIG. 8 is a schematic view illustrating the cross-section of the unit cell of the power semiconductor device according to a variation of the first embodiment of this invention, and the impurity concentration distribution of the respective pillar layers.

FIG. 8 is a schematic view illustrating the cross-section of the unit cell of the power MOSFET according to a variation of the first embodiment and the impurity concentrations of the respective pillar layers. As illustrated in the drawing, when a number of the p-pillar layers 4b arranged in the middle of the gate electrode 9 is large, the impurity concentrations of the respective pillar layers are continuously changed, whereby the generation of the charge unbalance of the SJ structure is suppressed, and stable high breakdown voltage can be obtained. As described above, in the SJ structure, when the charge of the adjacent pillar layers is depleted, they are preferably balanced to be substantially highly resistive. That is, the impurity concentration of the p-pillar layers and the impurity concentration of the n-pillar layers are preferably equal to each other, and when the balance collapses, the breakdown voltage becomes lower. Then, as illustrated in the drawing, the SJ structure is so formed that by setting the impurity concentrations of the respective pillar layers at intermediate concentrations between the impurity concentrations of the respective pillar layers and their adjacent ones, below the gate electrode 9, the impurity concentrations of the respective pillar layers are continuously different from the impurity concentrations of their adjacent pillar layers. This makes it possible that while the charge balance with the adjacent pillar layers is maintained, the concentrations of the pillar layers in the middle parts, and the ON resistance is decreased. On the other hand, preferably, the gate insulation film 8, whose retaining voltage is proportional to the thickness, is varied to be thick in the middle portion of the gate electrode 9.

A Second Embodiment

Figure 9:
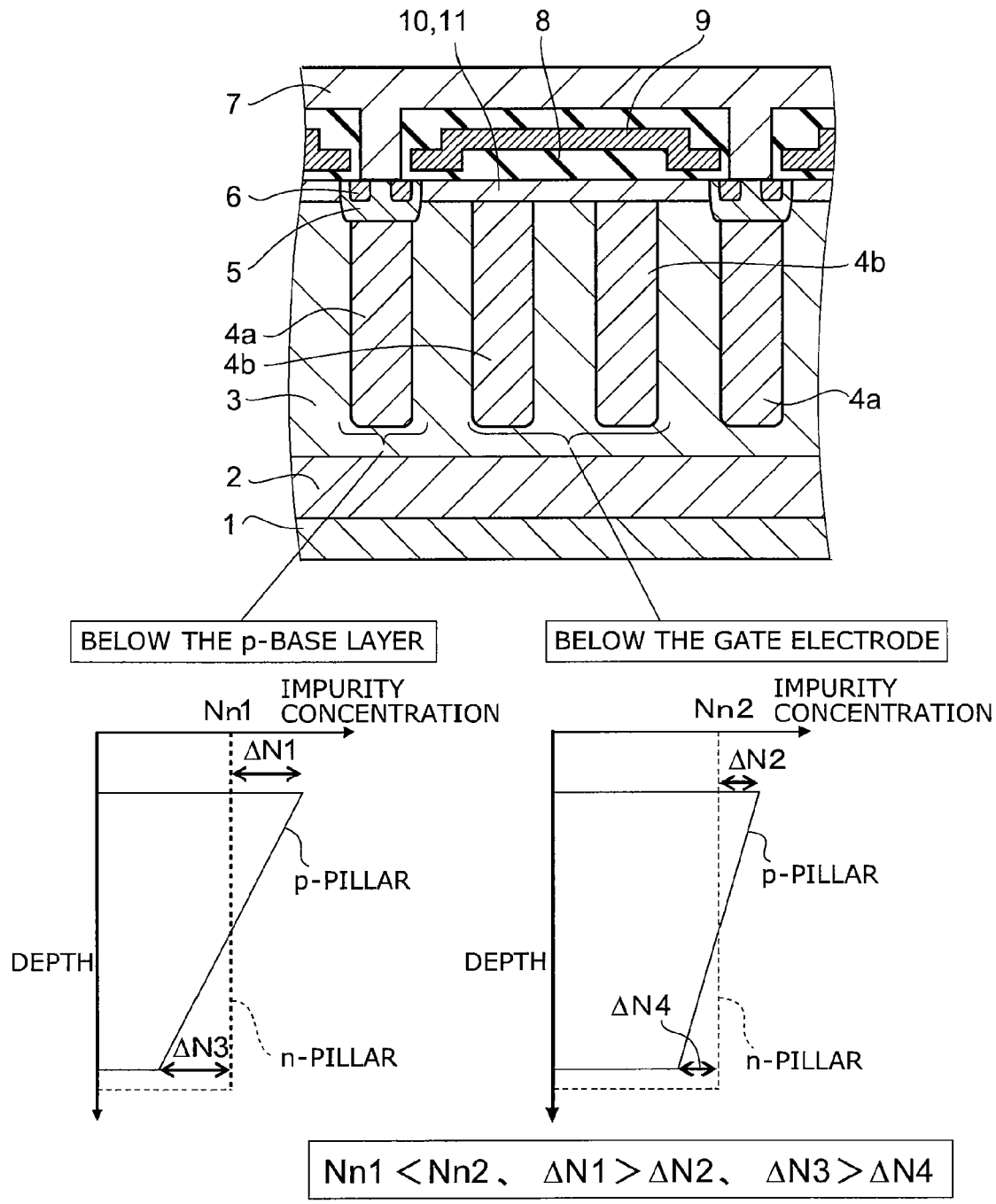
FIG. 9 is a schematic view illustrating the cross-section of the unit cell of the power semiconductor device according to a second embodiment of this invention, and the impurity concentration distributions of the respective pillar layers.

FIG. 9 is a schematic view illustrating the cross-section of the unit cell of the power MOSFET according to a second embodiment of this invention, and the impurity concentration of the p-pillar layers.

In the configuration of this embodiment, the impurity concentration of the p-pillars 4a, 4b varies in a depth direction. As shown in the drawing, the impurity concentration of the p-pillar layers 4a, 4b is higher on the side of the source electrode 7 (the side of the surface of the semiconductor substrate 21) and lower on the side of the drain electrode 1 (the side of the underside of the semiconductor substrate 21). On the side of the source electrode 7, the impurity concentration of the p-pillar layers 4a, 4b is higher than the impurity concentration of the adjacent n-pillars 3, and on the side of the drain electrode 1, the impurity concentration of the p-pillar layers 4a, 4b is lower than the impurity concentration of the adjacent n-pillar layers 3. Furthermore, concentration differences $\Delta N2$, $\Delta N4$ between the p-pillars 4b and its adjacent n-pillar layers 3 below the middle portion of the gate electrode 9 are smaller than concentration differences $\Delta N1$, $\Delta N3$ between the p-pillar layer 4a connected to the p-base layers 5 and their adjacent n-pillar layers 3

In the p-pillar layers 4a, connected to the p-base layers 5, $\Delta N1$, $\Delta N3$ are made larger, whereby the electric fields in the upper and the lower ends of the SJ structure become lower. This makes it possible to make the generation of negative resistance difficult and realize higher avalanche breakdown voltage below the p-base layers 5 than the avalanche breakdown voltage blow the middle portion of the gate electrode 9, even when a large number of carriers are generated in an avalanche breakdown process.

On the other hand, the holes generated below the middle portion of the gate electrode 9 are discharged into the source electrode 7 via the p-base layer 5. Accordingly, the discharge path of the holes is long, and the discharge resistance is high. When many carriers are generated below the middle portion of the gate electrode 9 due to the avalanche breakdown, the holes are not easily discharged, and the avalanche breakdown voltage tends to be lower.

Then, in this embodiment, $\Delta N2$ and $\Delta N4$ of the p-pillar layers 4b are made smaller than $\Delta N1$, $\Delta N3$ of the p-pillar layers 4a to thereby make it difficult to cause the avalanche breakdown below the middle part of the gate electrode 9. That is, the avalanche breakdown is positively caused immediately below the p-base layers 5, where the avalanche quantitative resistance is increased so that a generally high avalanche quantitative resistance can be obtained.

The impurity concentration $Nn2$ of the n-pillar layers 3 adjacent to the p-pillar layers 4b can be made higher than the impurity concentration $Nn1$ of the n-pillar layers 3 adjacent to the p-pillar layers 4a immediately below the p-base layers 5. This accompanies the configuration of the above described first embodiment (see FIG. 1) and is for lowering the ON resistance.

Figure 10:
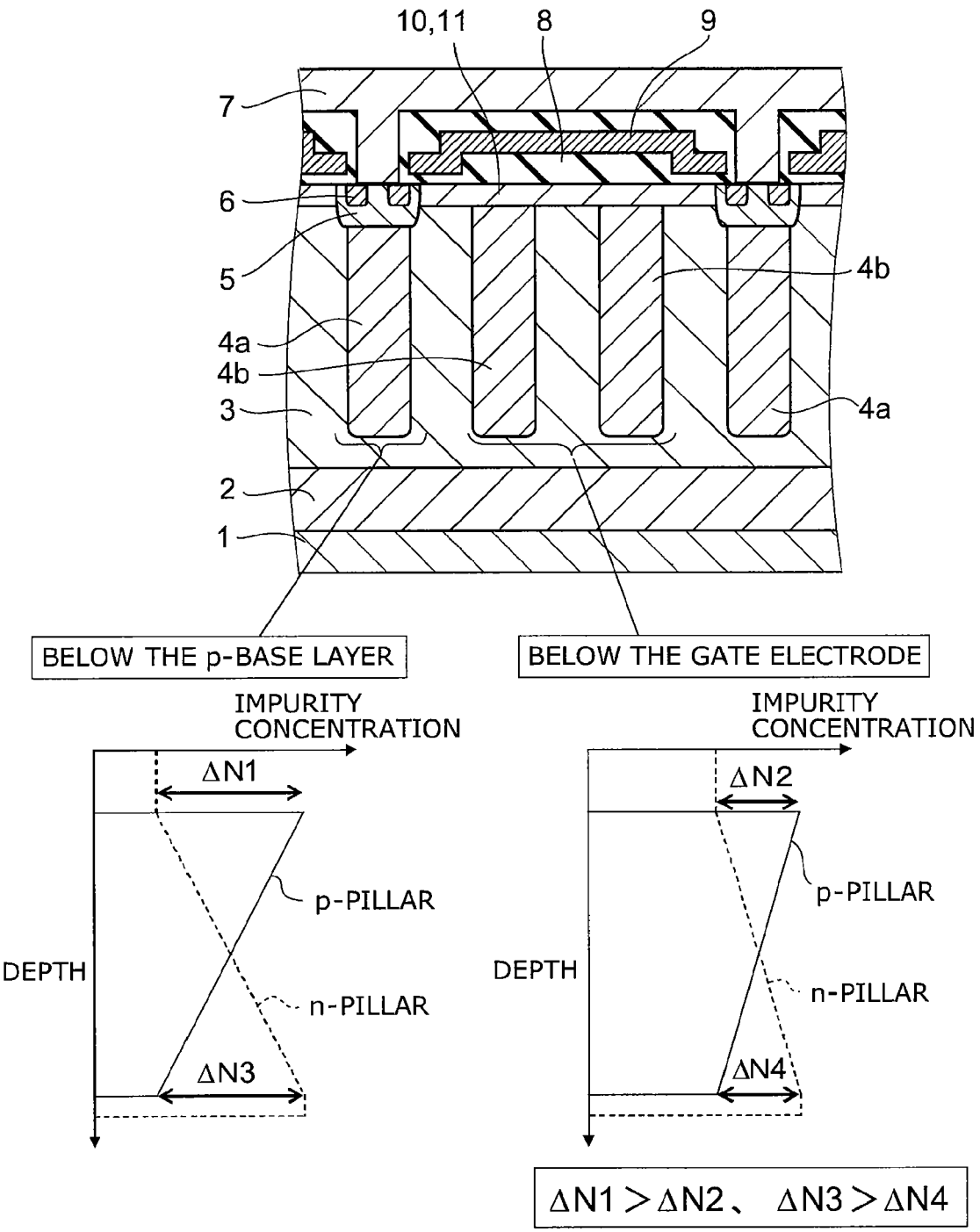
FIG. 10 is a schematic view illustrating a cross-section of the unit cell of the power semiconductor device according to a variation of the second embodiment of this invention, and the impurity concentration distributions of the respective pillar layers.

FIG. 10 is a schematic view illustrating a cross-section and the impurity concentration distribution of the unit cell of the power MOSFET according to a variation of the above-described second embodiment. In the embodiment illustrated in FIG. 9, the example that the impurity concentrations of the p-pillar layers 4a, 4b are varied is described, but the same effect can be obtained by, as illustrated in FIG. 10, varying the impurity concentrations both of the p-pillar layers 4a, 4b and the n-pillar layers 3.

In this embodiment, the impurity concentrations of the p-pillar layers 4a, 4b are high on the side of the source electrode 7 and low on the side of the drain electrode 1. On the other hand, the impurity concentration of the n-pillar layers 3 is low on the side of the source electrode 8 and high on the side of the drain electrode 1. This makes the electric fields in the upper and the lower ends of the SJ structure smaller than those of the embodiment illustrated in FIG. 9 and increases the avalanche breakdown voltage. In this embodiment as well, the concentration differences $\Delta N2$, $\Delta N4$ between the p-pillar layers 4b below the middle portion of the gate electrode 9 and the adjacent n-pillar layers 3 are made smaller than the concentration differences $\Delta N1$, $\Delta N3$ between the p-pillar layers 4a and the adjacent n-pillar layers 3. This allows the avalanche current to be positively flowed immediately below the p-base layers 5 to thereby realize high avalanche quantitative resistance.

A Third Embodiment

Figure 11:
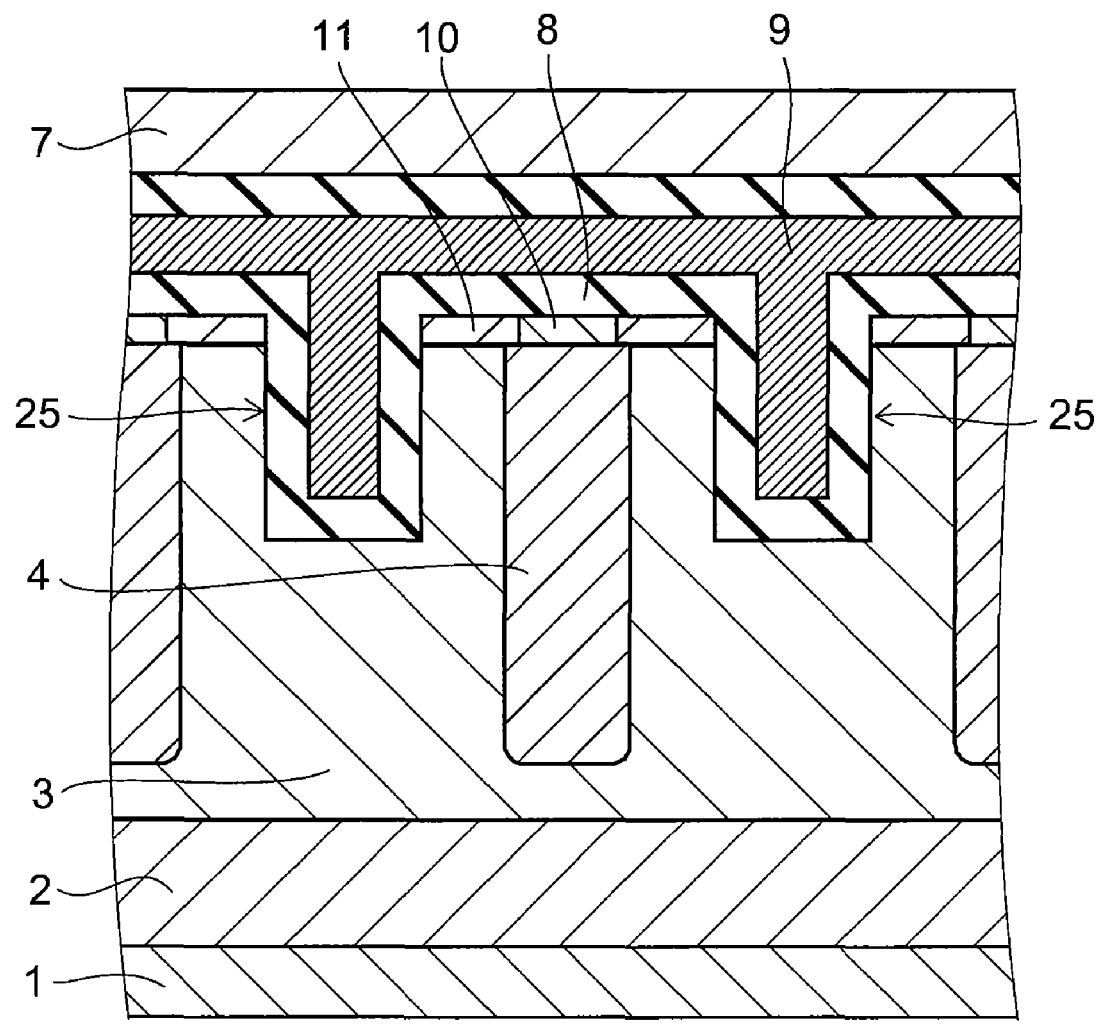
FIG. 11 is a schematic view illustrating a cross-section of the unit cell of the power semiconductor device according to a third embodiment of this invention.

FIG. 11 is a schematic view illustrating a cross-section of the unit cell of the power MOSFET according to a third embodiment of this invention. The cross-sectional configuration illustrated in the drawing is of the MOSFET illustrated in FIG. 1 the SJ structure applied to, which includes the p-pillar layers and the n-pillar layers arranged in a mesh illustrated in FIG. 5. The cross-section illustrated in the drawing illustrates the A-A cross-section (see FIG. 5) orthogonal to the cross-section illustrated in FIG. 1.

In this embodiment, trenches 25 are formed on both sides of a p-pillar layer 4, and a gate insulation film 8 and a gate electrode 9 are buried in the trenches 25. When a voltage is applied to the gate electrode 9, storage channels are formed in the interface between the gate insulation film 8 and the n-pillar layers 3. Thus, the resistance to the expansion of electrons from the n-source layer 6 can be decreased, and the ON resistance can be decreased.

As an effect intrinsic to the trench gate structure, the electrode cross-sectional area is larger at the parts buried in the trenches 25, whereby the built-in gate resistance of the gate electrode 9 is decreased. Thus, the uniformity of the gate voltage in the chip is improved, and the switching speed can be raised.

Figure 12:
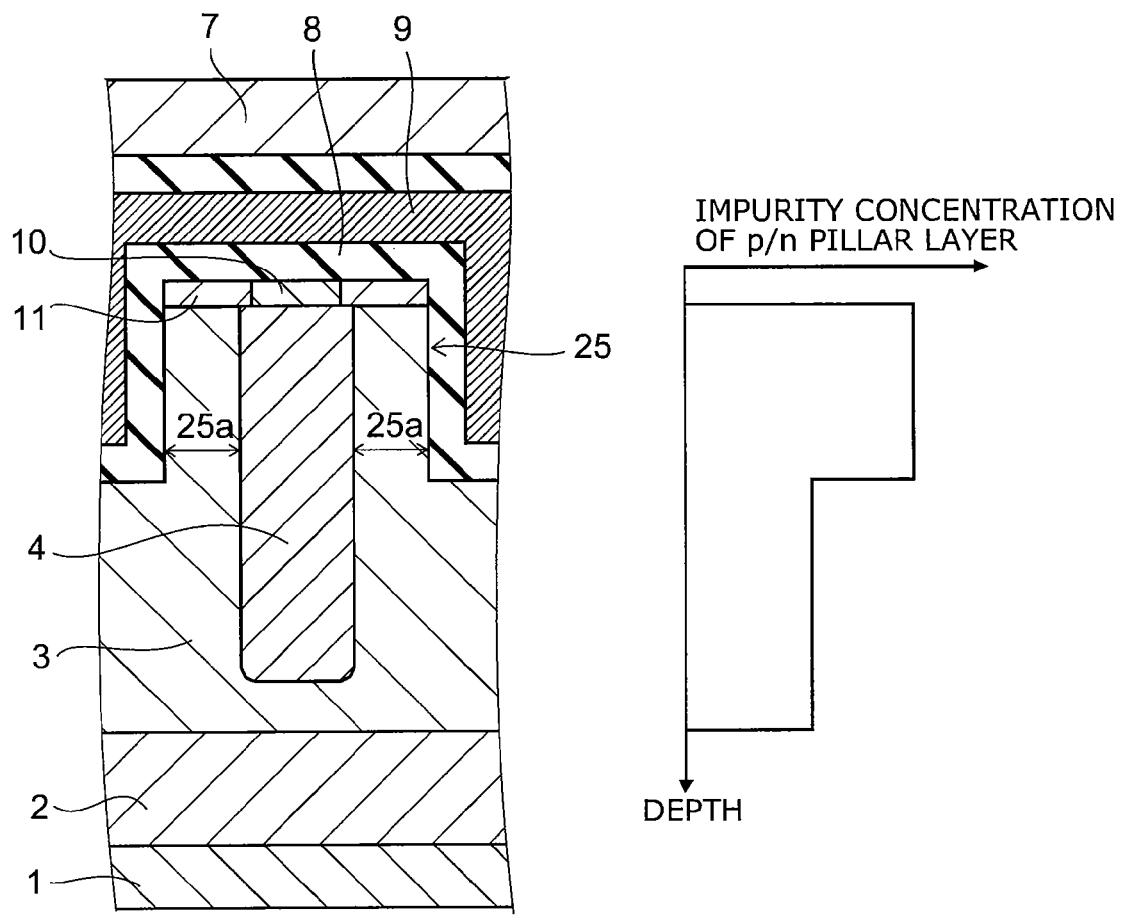
FIGS. 12 and 13 is a schematic view illustrating a cross-section of the unit cell of the power semiconductor device according to a variation of the second embodiment of this invention, and the impurity concentration distribution of the respective pillar layers.

Furthermore, as illustrated in FIG. 12, in the parts 25a sandwiched by the trench 25 and the p-pillar layer 4, in addition to the depletion layer extended from the p-pillar layer 4, the depletion layer is extended also from the gate insulation film 8. Accordingly, all the parts 25a is easily depleted, and the electric field is less intensive, and higher voltage resistance can be obtained in comparison with that obtained without the trench 25. Thus, as illustrated in the drawing, the impurity concentration of the n-pillar layers 3 in the parts 25a where the trench is formed and the impurity concentration of the p-pillar layer 4 can be increased, and lower ON resistance can be realized.

Figure 13:
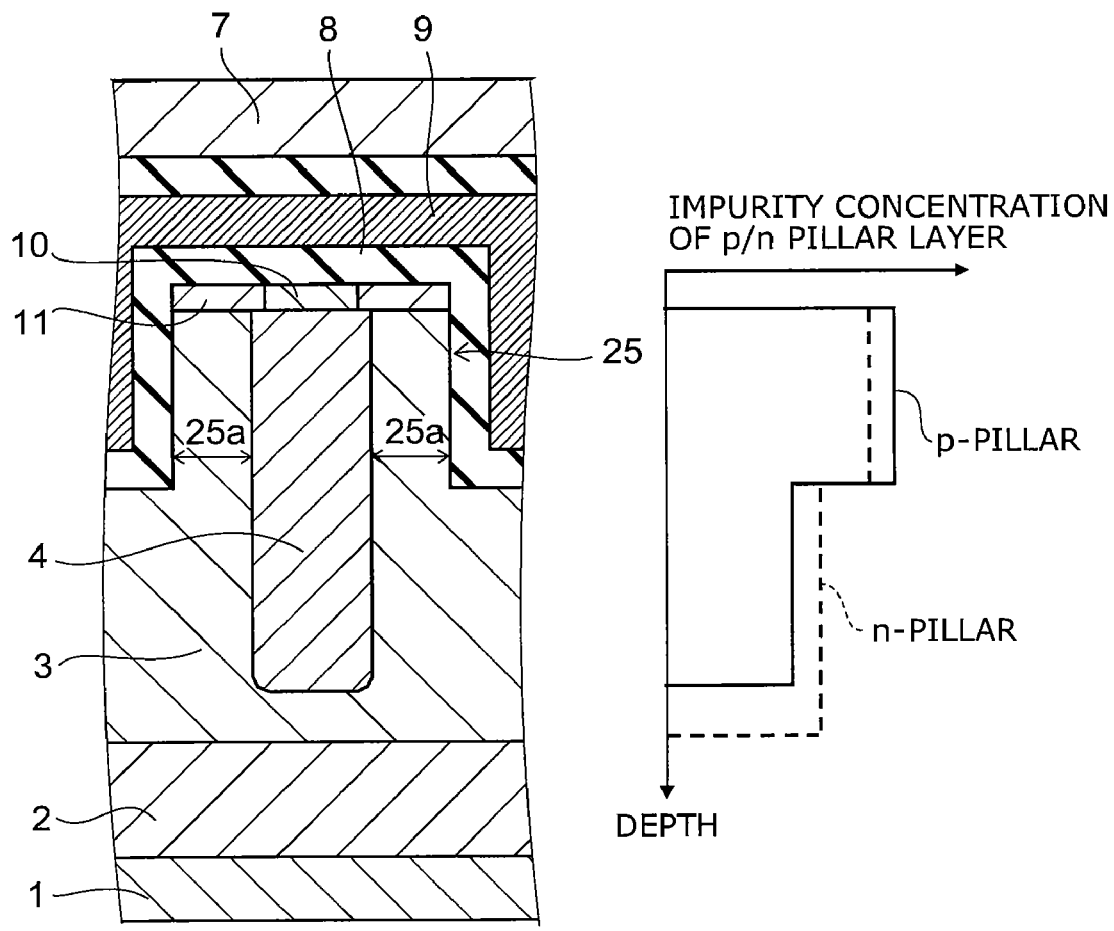

As illustrated in FIG. 13, the impurity concentrations of the p-pillar layer 4 and the n-pillar layers 3 are varied in a depth direction, whereby it is possible to obtain high avalanche breakdown voltage. That is, as in the second embodiment described above, the impurity concentration of the p-pillar layer 4 is higher on the side of the source electrode 7 than the impurity concentration of the n-pillar layers 3, and the impurity concentration of the n-pillar layers 3 is higher on the side of the drain electrode 1 than the impurity concentration of the p-pillar layer 4, whereby the electric fields in the upper and the lower ends of the super junction structure become lower, and higher avalanche breakdown voltage can be obtained.

A Fourth Embodiment

Figure 14:
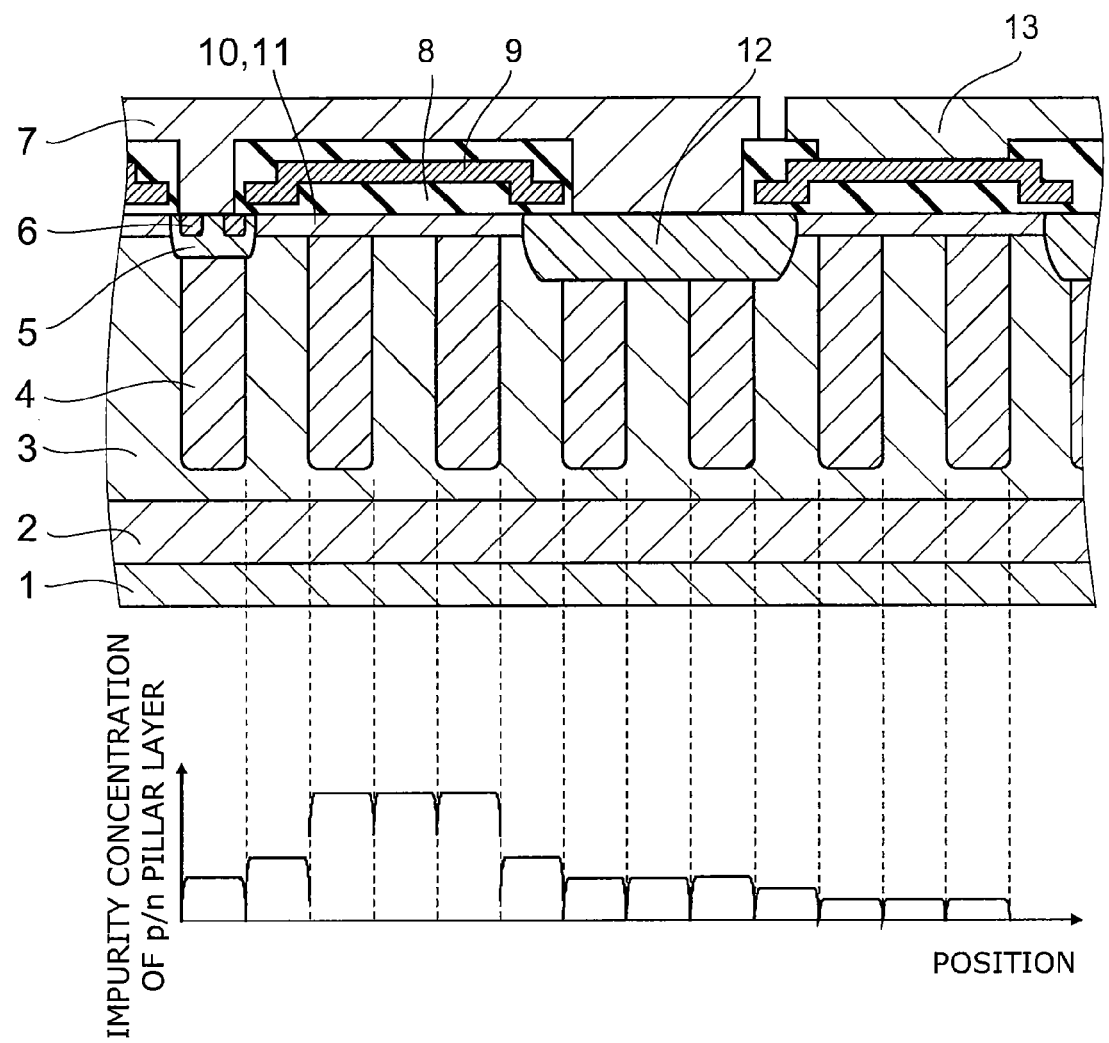
FIG. 14 is a schematic view of a cross-section of the power semiconductor device according to a fourth embodiment of this invention and the impurity concentration distribution of the respective pillar layers.

FIG. 14 is a schematic view of a cross-section of the power MOSFET according to a fourth embodiment of this invention and the impurity distribution of the SJ structure. The configuration of the parts illustrated in the drawing, where the p-base layers 5 are formed is the same as the configuration of the first embodiment and the second embodiment described above. In this embodiment, a guard ring layer 12 illustrated at the middle of the drawing is formed below an edge of a gate pad 13 (gate lead-out electrode). The guard ring layer 12 is formed deeper than the p-base layers 5, whereby the discharge of the holes generated in the adjacent n-pillar layers 3 can be made speedy, and the avalanche breakdown voltage at around the gate pad 13 is increased.

On the other hand, in the configuration illustrated in the drawing, when the avalanche breakdown takes place in the SJ structure below the gate pad 13, the discharge path of the holes is long, and the avalanche quantitative resistance tends to lower. Then, the guard ring layer 12 may be extended to a region below the gate pad 13 to thereby make the hole discharge smooth, whereby the avalanche breakdown voltage below the gate pad 13 can be increased. To increase the voltage resistance below the gate pad 13, preferably, as shown by the impurity distribution in the drawing, the impurity concentration of the pillar layers below the gate pad 13 is made lower than the impurity concentrations of the pillar layers in the other region.

Figure 15:
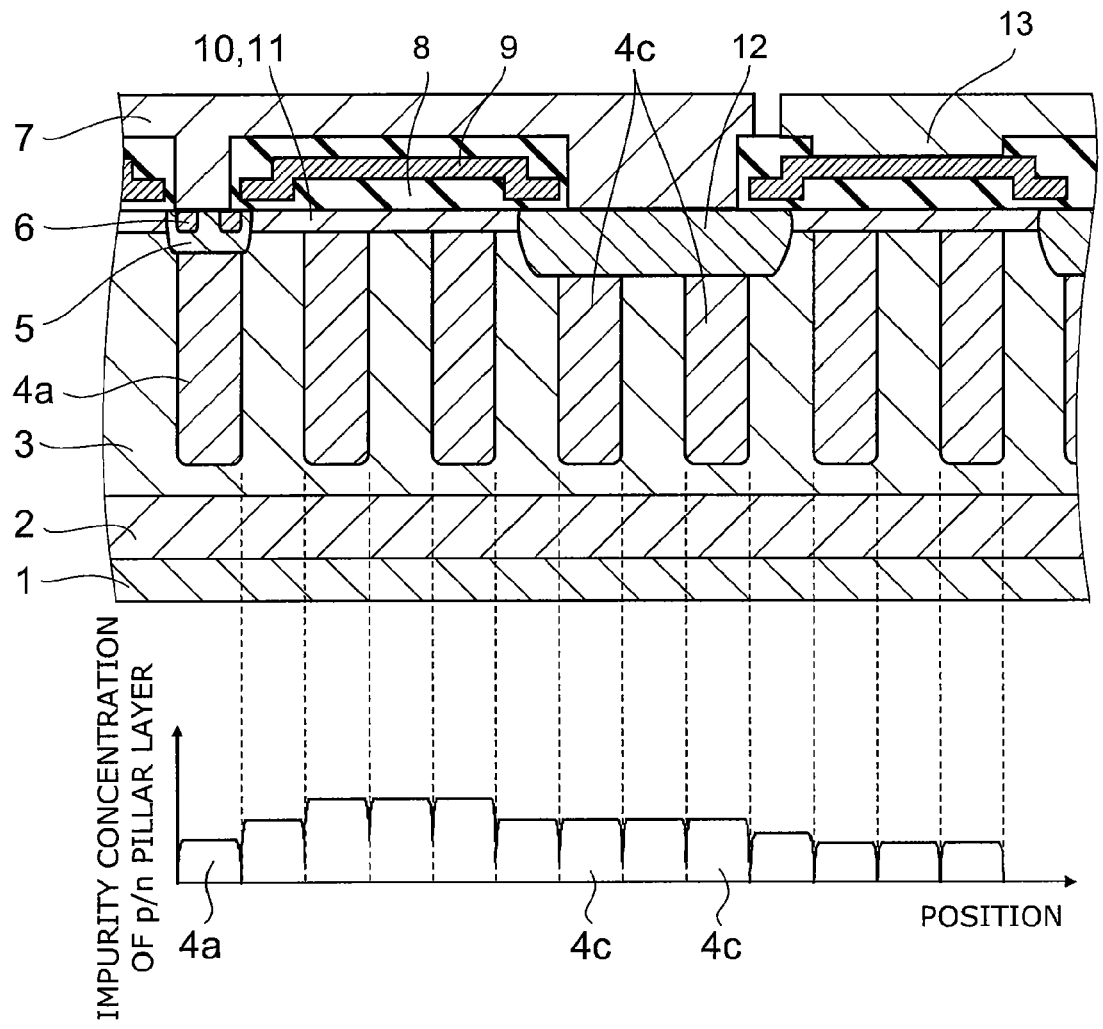
FIG. 15 is a schematic view of a cross-section of the power semiconductor device according to a variation of the fourth embodiment of this invention, and the impurity concentration distribution of the respective pillar layers.

As illustrated in FIG. 15, the impurity concentration of the p-pillar layers 4c below the guard ring layer 12 is made higher than the impurity concentration of the p-pillar layers 4a below the p-base layers 5, whereby the avalanche breakdown is positively caused to take place immediately below the guard ring layer 12, whose hole discharge resistance is low, and high avalanche breakdown voltage can be obtained.

A Fifth Embodiment

Figure 16:
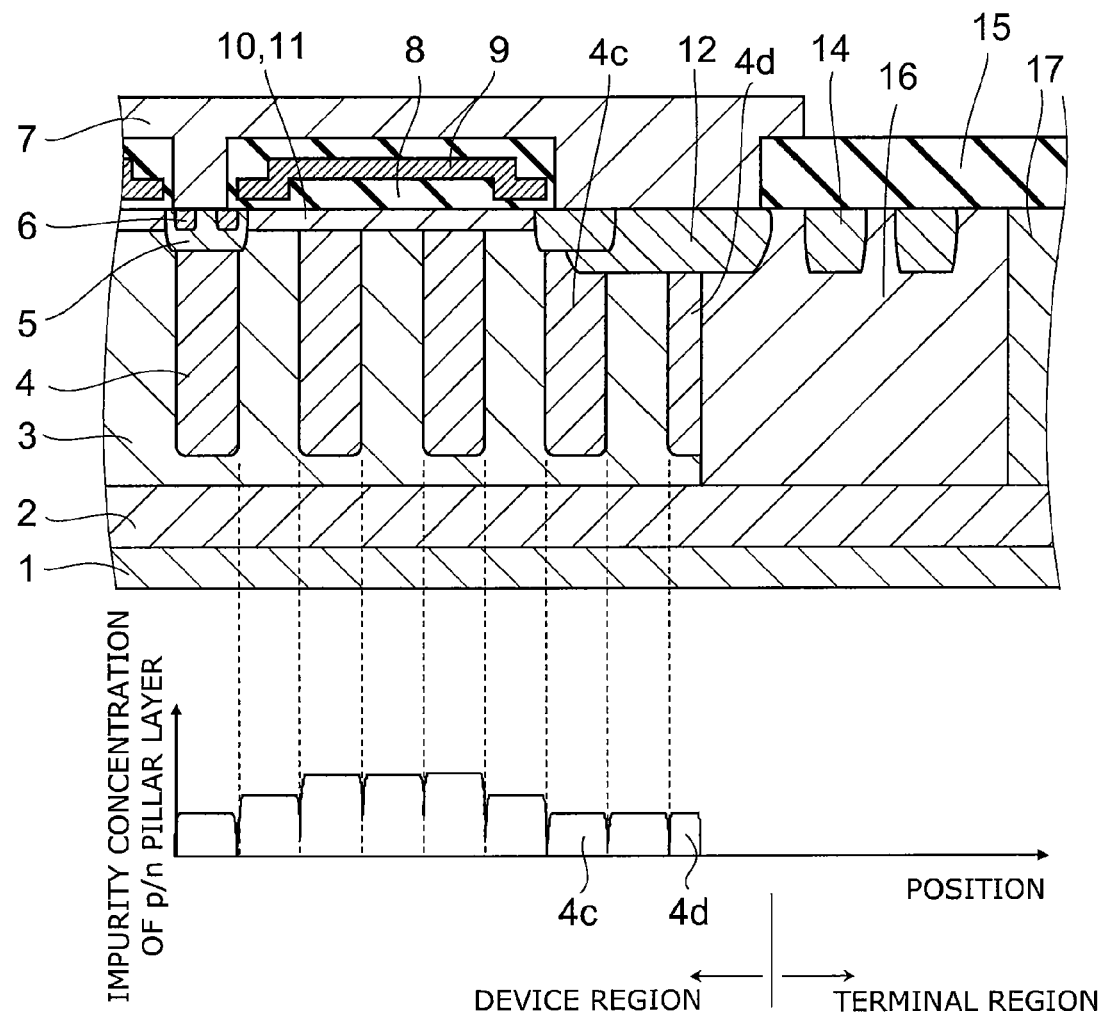
FIG. 16 is a schematic view illustrating a cross-section of the power semiconductor device according to a fifth embodiment of this invention, and the impurity concentration distribution of the respective pillar layers.

FIG. 16 is a schematic view illustrating a cross-section of the power MOSFET according to a fifth embodiment of this invention. This embodiment relates to the device configuration including the device terminal region.

In the device configuration illustrated in the drawing, the configuration of the device region where the p-base layers 5 and the gate electrode 9 are formed is the same as that of the first embodiment and the second embodiment described above. On the other hand, the terminal region of the device must have a configuration that ensures higher breakdown voltage than the device region at the middle of the device so as to make the device highly reliable. Then, as illustrated in the drawing, in the terminal region below the field insulation film 15, the SJ structure is not formed, but a high resistance $n^-$ layer 16, which is the ninth semiconductor layer, is formed. Thus, the voltage resistance of the terminal region is not influenced by the imbalance of the impurity concentrations of the SJ structure and is determined by the avalanche breakdown voltage of the terminals of the high resistance $n^-$ layer 16. Furthermore, a guard ring layer 12, which is the eighth semiconductor layer, deeper than the p-base layers 5 is formed around the outer periphery of the device region so as to suppress the electric field concentration of the ends of the p-base layers 5. Thus, the holes generated in the terminal region can be positively discharged via the guard ring layer 12, whereby high avalanche breakdown voltage and recover voltage can be obtained. To mitigate the electric field in the end of the guard ring layer 12 on the side of the field insulation film 15, a plurality of the second guard ring layers 14, which are the tenth semiconductor layer, are formed on the surface of the high resistance $n^-$ layer 16.

Furthermore, preferably, the outermost p-pillar layer 4d of the SJ structure has a sheet impurity concentration which is a half of the impurity concentration of the inner p-pillar layers 4c. Because of the high resistance $n^-$ player 16 formed on the outside of the SJ structure, this permits the depletion layer to easily extend to the high resistance layer 16 and not to easily extend to the SJ structure. The impurity doped in the high resistance $n^-$ layer 16 is extremely little in comparison with that of the n-pillar layers 3. Accordingly, the outermost p-pillar layer 4d of the SJ structure has the charge balance with the n-pillar layers. Accordingly, unless the sheet concentration of the outermost p-pillar layer 4d is formed to have a half of the sheet concentration of the adjacent p-pillar layer 4c, the charge balance upon the depletion is broken, and the voltage resistance lowers.

Figure 17:
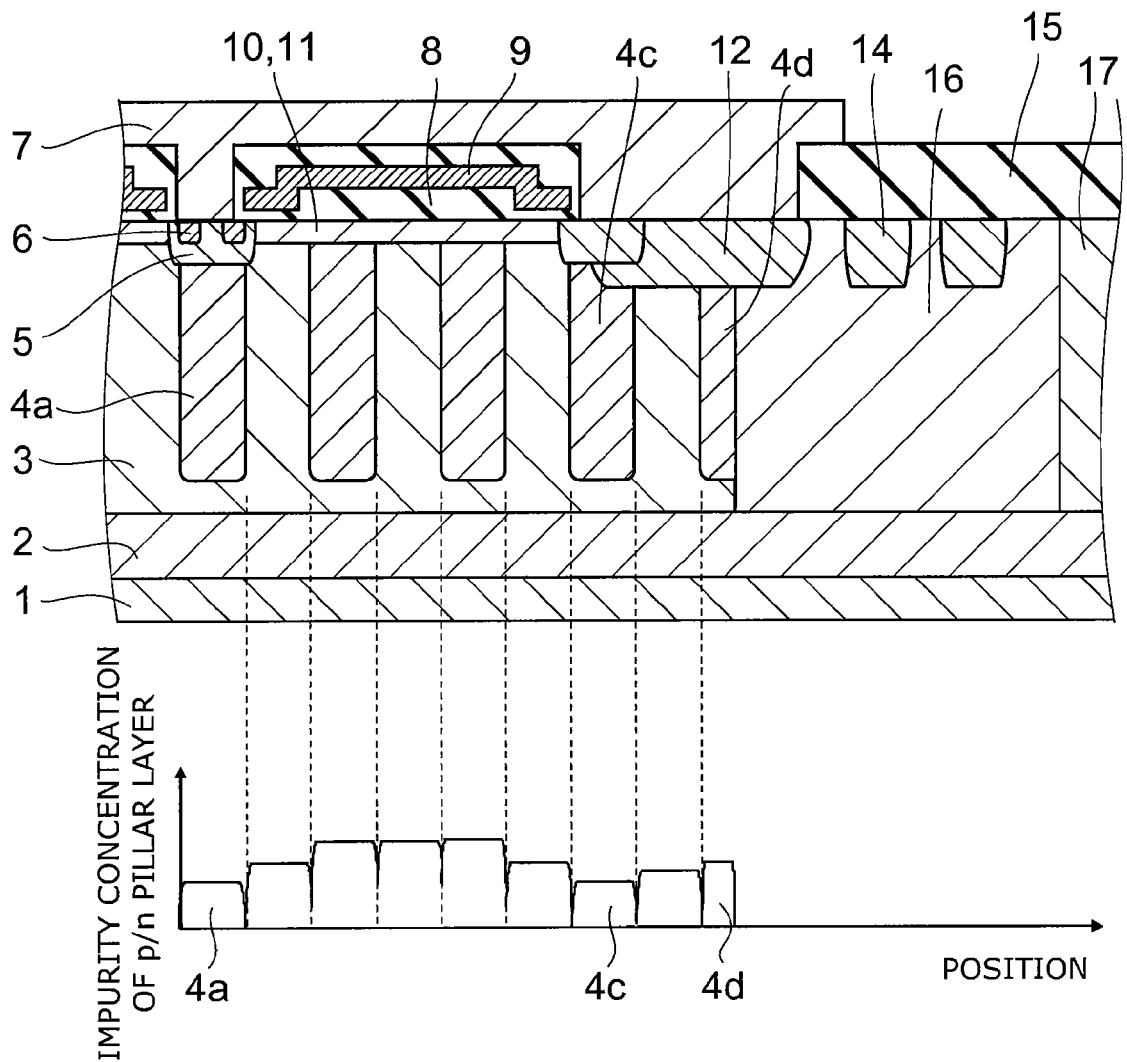
FIG. 17 is a schematic view illustrating a cross-section of the power semiconductor device according to a variation of the fifth embodiment of this invention, and the impurity concentration distribution of the respective pillar layers.

To prevent the depletion layer extended in the terminal region from reaching the dicing line, preferably, a filed stop n-layer 17 is formed in the outermost border. The field stopper n-layer 17 can be easily formed by ion implantation simultaneous with the n-pillar layers 2. Furthermore, as illustrated in FIG. 17, the impurity concentration of the outermost p-pillar layer 4d below the guard ring layer 12 is made higher than the impurity concentration of the n-pillar layer 4a below the p-base layers 5 to thereby positively cause avalanche breakdown below the guard ring layer 12 whose hole discharge resistance is small, whereby high avalanche breakdown voltage can be obtained as well.

Other than this embodiment described above, terminal structures, such as the RESURF structure, field plate structure, etc., are used, and a deep guard ring layer 12 is formed in the outer periphery of the device region, whereby the breakdown voltage of the terminal region can be made higher.

A Sixth Embodiment

Figure 18:
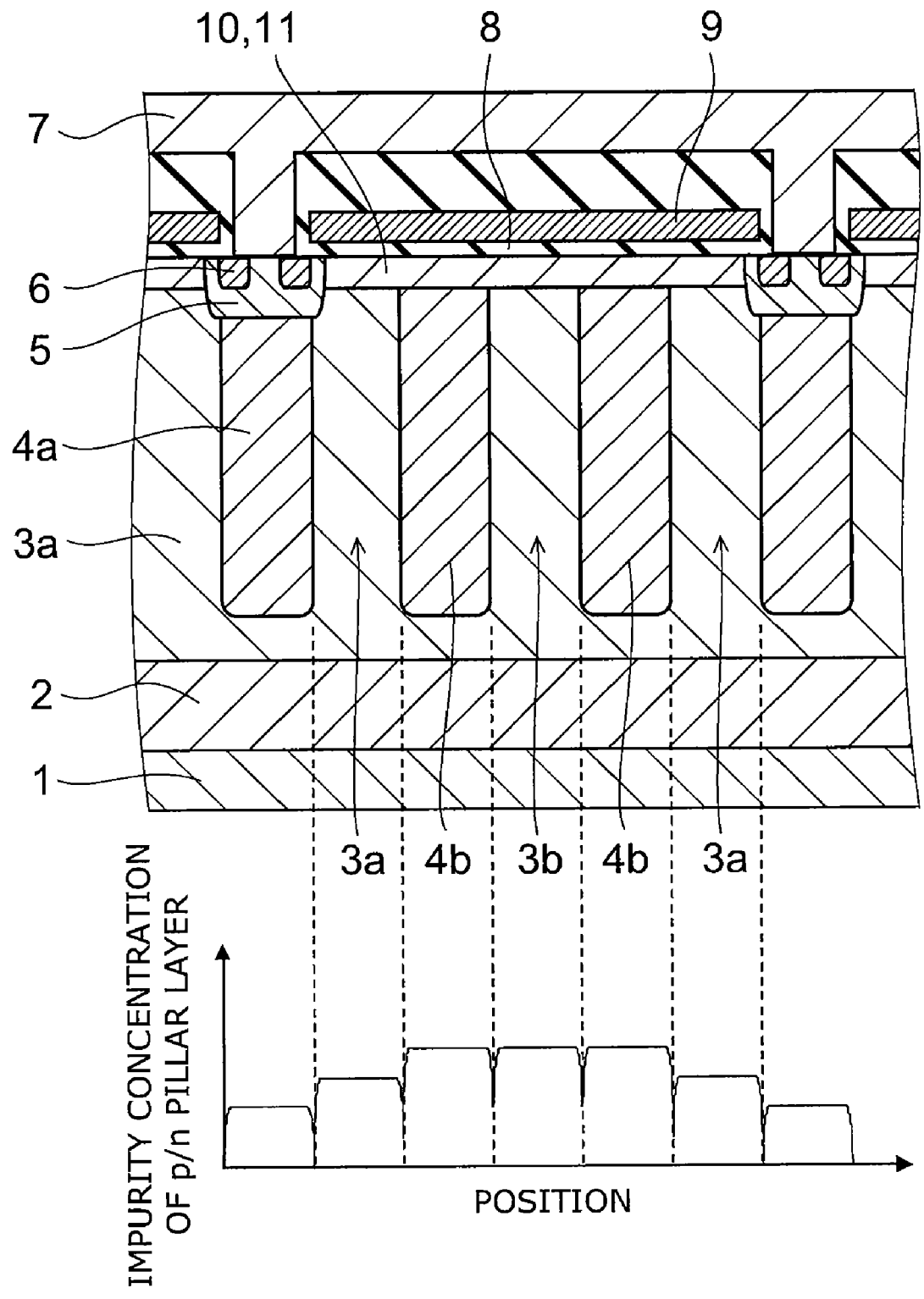
FIG. 18 is a cross-sectional view of the unit cell of the power semiconductor device according to a sixth embodiment of this invention, and the impurity concentration distribution of the respective pillar layers.

FIG. 18 is a cross-sectional view schematically illustrating the configuration of the power MOSFET according to a sixth embodiment. The power MOSFET illustrated in FIG. 18 has the planar gate structure having the gate insulation film 8 of a uniform thickness. In the above-described power MOSFET illustrated in FIG. 1, the terrace gate structure where the gate insulation film 8 is made thicker below the middle portion of the gate electrode 9 than on the p-base layers 5 is used. The power MOSFET according to this embodiment is different in the gate structure from the power MOSFET illustrated in FIG. 1, and both are the same in the other configurations.

In the power MOSFET according to this embodiment as well as in the power MOSFET illustrated in FIG. 1, the switching noise can be reduced, and besides, the ON resistance can be made lower, and the drain current density can be raised.

For example, when a high voltage is applied between the drain electrode 1 and the source electrode 7, and the surface p-pillar layers 10 are depleted, the p-base layers 5 and the p-pillar layers 4b below the gate electrode 9 are electrically disconnected from each other. As described above, this depletes sequentially first the p-pillar layer 4a and then the p-pillar layers 4b, and the change rate of the Cds-Vds characteristics becomes smaller. This makes the dVds/dt upon switching smaller, and the switching noise can be lowered.

In the ON state as well, the surface p-pillar layers 10 are depleted. Accordingly, the depletion layer cannot easily extend from the p-pillar layers 4b positioned below the gate electrode 9 to the adjacent n-pillar layers 3b. This prevents the width of the n-pillar layers 3b as the current channels from decreasing, whereby the saturation current density of the drain current increases, and larger current density operation becomes possible.

Furthermore, the use of planar gate structure in place of the terrace gate structure illustrated in FIG. 1 forms storage channels between the surface n-pillar layers 11 and the gate insulation film 8, and ON resistance lower than that of the power MOSFET illustrated in FIG. 1 can be obtained.

To easily obtain the above-described effect the impurity concentration of the surface p-pillar layers 10 can be made lower below the middle portion of the gate electrode 9 than the parts nearer to the p-based layers 5, as illustrated in FIG. 3. The same effect can be produced with the impurity concentration of the surface n-pillar layers 11 higher in the middle portion of the gate electrode 9 than the impurity concentration of the surface p-pillar layers 10. For example, by varying the impurity concentration of the surface n-pillar layers 11 between the p-base layers 5, the impurity concentration of the surface n-pillar layers 11 can be made higher than the impurity concentration of the surface p-pillar layers 10 below the middle portion of the gate electrode 9. That is, below the middle portion of the gate electrode 9, the impurity concentration of the surface n-pillar layers 11 can have a higher concentration profile than the impurity concentration in the portions nearer to the p-base layers.

As illustrated in FIGS. 9 and 10, the concentration difference between the p-pillar layers 4b and the n-pillar layers 3b below the gate electrode is made smaller than the concentration difference the p-pillar layers 4a and the n-pillar layers 3a below the p-base layers 5, whereby the breakdown voltage in the OFF state can be made higher. Thus, as illustrated in FIG. 18, the impurity concentration of the n-pillar layers 3b and the p-pillar layers 4b below the gate electrode 9 can be made higher, and the ON resistance becomes lower. In FIGS. 9 and 10, the profiles containing the concentration difference between the n-pillar layers 3 and the p-pillar layers 4 are shown, but, for example, below the middle portion of the gate electrode 9, the impurity concentration of the p-pillar layers 4b and the impurity concentration of n-pillar layers 3b can be made equal to each other.

Figure 19:
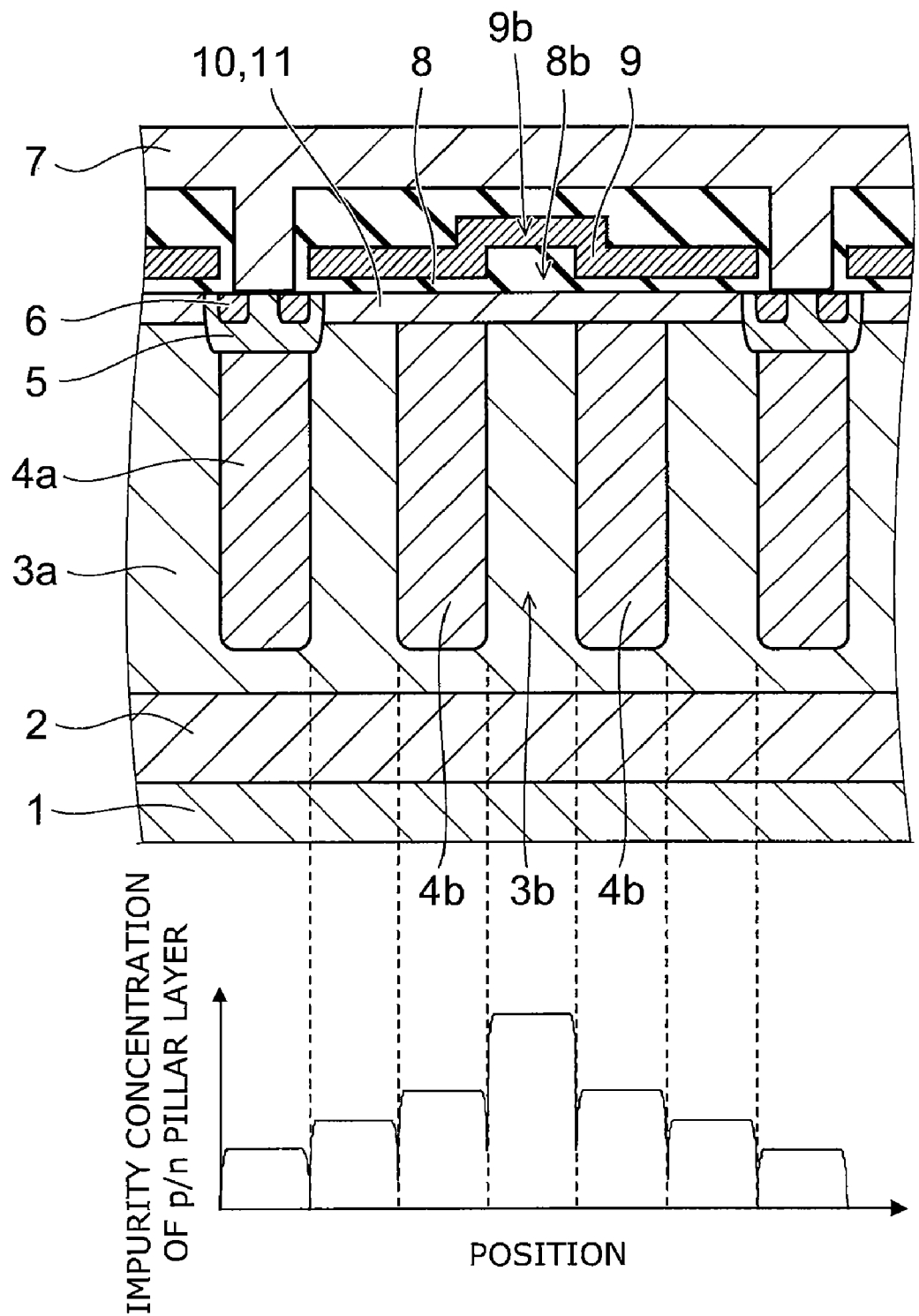
FIG. 19 is a cross-sectional view of the unit cell of the power semiconductor device according to a variation of the sixth embodiment of this invention, and the impurity concentration distribution of the respective pillar layers.

FIG. 19 is a cross-sectional view schematically illustrating the configuration of the power MOSFET according to a variation of the sixth embodiment. As illustrated in the drawing, the terrace gate structure having the gate insulation film 8 can be partially thickened.

The power MOSFET according to this variation has the impurity concentration of the n-pillar layers 3b below the thicker part 8b of the gate insulation film made higher. This can make the ON resistance lower than the ON resistance of the power MOSFET illustrated in FIG. 18. As shown in this variation, with the breakdown voltage retained by partially increasing the gate insulation film 8, the impurity concentration of the n-pillar layers 3b corresponding to the thicker portion of the gate insulation film 8 can be made higher than the impurity concentration of the n-pillar layer 3b disposed below the center of the gate electrode 9 shown in FIG. 18. In addition, the impurity concentration of the p-pillar layers adjacent to the n-pillar layers 3b disposed below the thicker portion of the gate insulation film 8 can be made higher, so as to make charge balance between the p-pillar layers 4b and the n-pillar layer 3b.

A Seventh Embodiment

Figure 20:
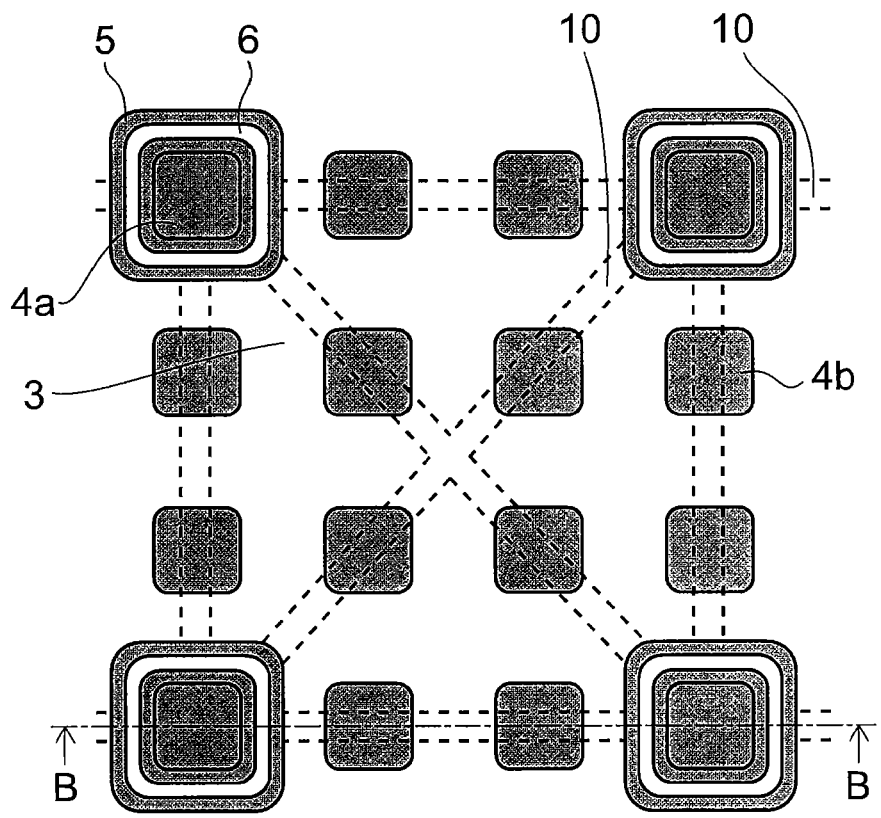
FIG. 20 is a schematic view illustrating the plane layout of the semiconductor layers forming the power semiconductor device according to a seventh embodiment.

FIG. 20 is a schematic view illustrating the plane layout of the semiconductor layers forming the power semiconductor device according to a seventh embodiment and illustrates the layout of p-pillar layers 4 and p-base layers 5. In this embodiment, as illustrated in the drawing, dot-shaped p-pillar layers 4 and the p-base layers 5 are laid out in a matrix in respective periodic arrangements. The cross-section along the B-B' in the drawing can be, e.g., the cross-sectional configuration illustrated in FIG. 18. On the surface of the p-base layers 5, n-source layers 6 are provided, and p-pillar layers 4a are laid out below the p-base layers.

The up-to-down and the transverse periodic widths in FIG. 20 are wider for the p-base layers 5 than for the p-pillar layers 4. The gate electrode 9 not illustrated is extended over a matrix between the p-base layers 5. The p-pillar layers 4b, which are not directly connected to the p-base layers 5, are connected to the respective p-base layers 5 via the surface p-pillar layers 10. Between the surface p-pillar layers 10, the surface n-pillar layers 11 not illustrated are provided in contact with the n-pillar layers 3 and the p-pillar layers 4b. Thus, the surface p-pillar layers 10 and the surface n-pillar layers 11 are alternately provided transversely on the n-pillar layers 3 and the p-pillar layers 4b.

In the plane layout illustrated in FIG. 20 as well, when the surface p-pillar layers 10 are depleted, the electric connection between the p-pillar layers 4b positioned below the gate electrode 9 and the p-base layers 5 is disconnected. This lowers the switching noise, as in the above-described embodiments. In the p-pillar layers 4b electrically disconnected from the p-base layers 5, the expansion of the depletion layer is suppressed, and the current channels in the n-pillar layers 3 are not narrowed, and the ON resistance can be decreased.

Furthermore, in the central region (below the middle portion of the gate electrode 9) surrounded by the 4 p-base layers 5 illustrated in FIG. 20, the impurity concentration of the n-pillar layer 3 can be set high, whereby the ON resistance can be lowered. Accordingly, the maximum drain current can be increased, and large current density operation can be realized.

In comparison with the configuration having the p-base layers 5 and the gate electrodes 9 arranged in stripes as in, e.g., the first embodiment illustrated in FIGS. 2 to 4, the area of the gate electrode 9 (not illustrated in FIG. 20) can be relatively increased. This allows the number of the heavily-doped n-pillar layers 3 positioned below the gate electrode 9 to be increased, which can more decrease the ON resistance than the configuration of the p-base layers 5 and the gate electrodes 9 arranged in stripes.

Furthermore, this layout of the surface p-pillar layers 10 as illustrated in FIG. 20 decreases the interval between the surface p-pillar layers 10 as the surface p-pillar layers 10 are nearer the p-base layers 5. This can make relatively high the concentrations of the surface n-pillar layers 11 and the surface p-pillar layers 10 in the portions near to the p-base layers 5. In the ON state, the current density is higher nearer the p-base layers 5. Accordingly, the concentration of the surface n-pillar layers 11 can be made higher in the portions near the p-base layers 5, whereby the ON resistance can be decreased.

The gate configuration to be applied to the power MOSFET including the n-pillar layers 3 and the p-base layers 5 illustrated in FIG. 20 is not limited to a specific MOS gate electrode, and the terrace gate structure as illustrated in FIGS. 1 and 19 is applicable. The planar gate structure illustrated in FIG. 18 may be applied.

Figure 21:
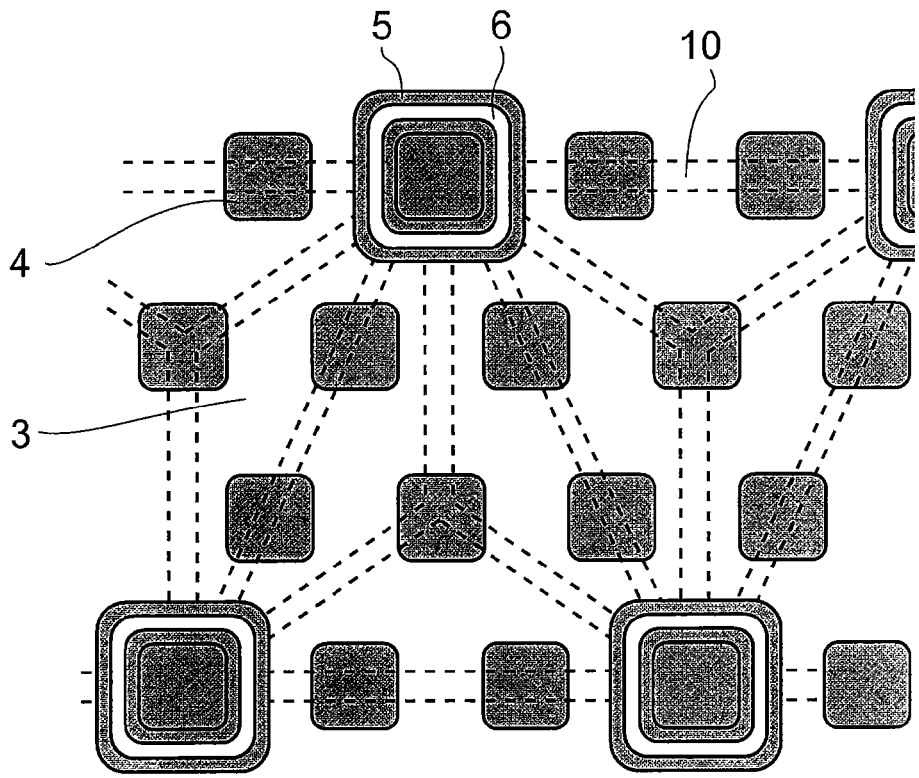
FIGS. 21,22 and 23 is a schematic view illustrating the plane layout of the semiconductor layers forming the power semiconductor device according to a variation of the seventh embodiment.
Figure 22:
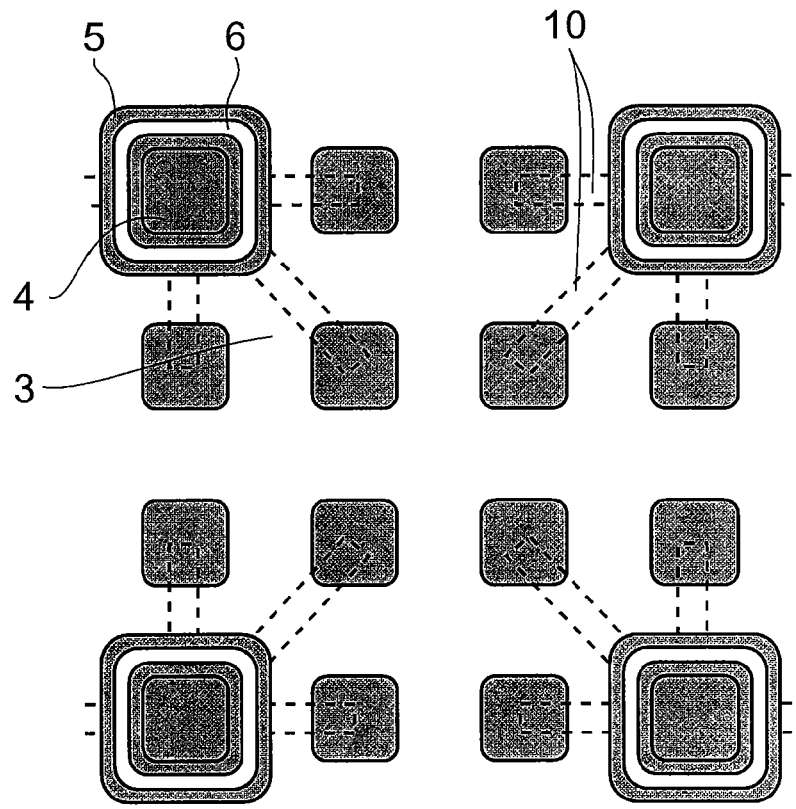
Figure 23:
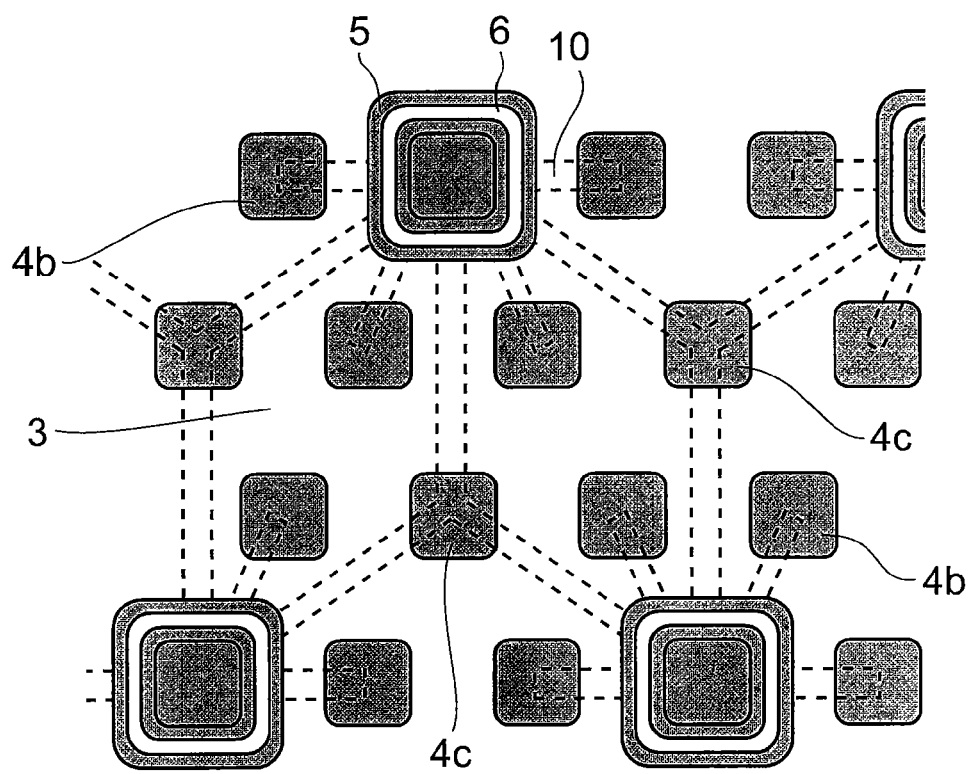

FIGS. 21 to 23 are plain views schematically illustrating the layouts of the p-pillar layers 4 and the p-base layers 5 of variations of the seventh embodiment. As illustrated in FIG. 21, the p-pillar layers 4 and the p-base layers 5 are arranged in a dot-shaped pattern offset horizontally as viewed in the drawing.

The dot-shaped p-pillar layers 4 and the p-base layers 5 illustrated in FIG. 21 are arranged in columns and having the phase shifted in the respective columns. In the example illustrated in FIG. 21, the p-pillar layers 4 and the p-base layers 5 are arranged in a zigzag having the phase horizontally shifted. The p-pillar layers 4 positioned between the adjacent p-base layers 5 are electrically connected to a plurality of the p-base layers 4 via surface pillar layers 10.

The p-pillar layers 4 may be connected to any one of the p-base layers 5 via the surface p-pillar layers 10. Accordingly, as illustrated in FIGS. 22 and 23, the layout is made with the respective p-pillar layers 4 being connected to the p-base layers 5 disposed in a location closest to the respective p-pillar layers 4 by the surface pillar layers 11.

In the layout of the p-pillar layer 4 and the p-base layers illustrated in FIG. 22, the p-pillar layers 4 are disposed between the p-base layers 5 provided apart from each other. The surface p-pillar layer 10 is provided to connect the p-pillar layer 3 to one of a plurality of the p-base layers 5 disposed in a location closest to the p-pillar layer 3. Hence, the surface p-pillar layers are disposed around the p-base layer 5 and the surface n-pillar layer 11 provided transversely on the n-pillar layers 3 and the p-pillar layers 4 includes portions disposed alternately with the surface p-pillar 10 around the p-base layer 5. Accordingly, below the middle portion of the gate electrode not illustrated between the adjacent p-base layers 5, a region where the surface p-pillar 10 is absent is formed. On the other hand, in the region where the surface p-pillar layer 10 is absent, the surface n-pillar layer 11 may be provided. Accordingly, the area of the surface n-pillar layers 11 can be relatively increased, and the ON resistance can be further decreased.

In the variation illustrated in FIG. 23, the p-pillar layers 44 and the p-base layers 5 are arranged in a zigzag having the horizontal phase shifted as in FIG. 21. The p-pillar layers 4b are disposed approximate to the respective base layers 5 and the respective p-pillar layers 4b are connected to the closest p-base layer 5 by the surface p-pillar layers 10. The p-base layers 4c more spaced from the respective p-base layers 5 than the p-pillar layers 4b are respectively connected between a plurality of the p-base layers 5 by the surface p-pillar layers 10. The surface n-pillar layers are also provided transversely on the n-pillar layers 3 and alternately disposed with the surface p-pillar 10 connecting between the p-pillar layers 4c and p-base layers 5.

In the p-pillar layers 4 and the p-base layers 5 illustrated in FIG. 23 as well, below the middle portion of the gate electrode provided between the adjacent p-base layers 5, a region where the surface p-pillar layer 10 is absent can be formed. Accordingly, the area of the surface n-pillar layers 11 not illustrated can be relatively increased, and the ON resistance can be decreased.

Furthermore, the configurations illustrated in FIGS. 22 and 23 are applicable to the configuration including the p-pillar layers 4 and the n-pillar layers 3, which are stripe-shaped as illustrated in FIGS. 1 and 18; for example, in FIG. 18, the surface p-pillar layers 10 contacting the surfaces of the n-pillar layers 3b may be partially replaced by portions of the surface n-pillar layers 11.

An Eighth Embodiment

Figure 24:
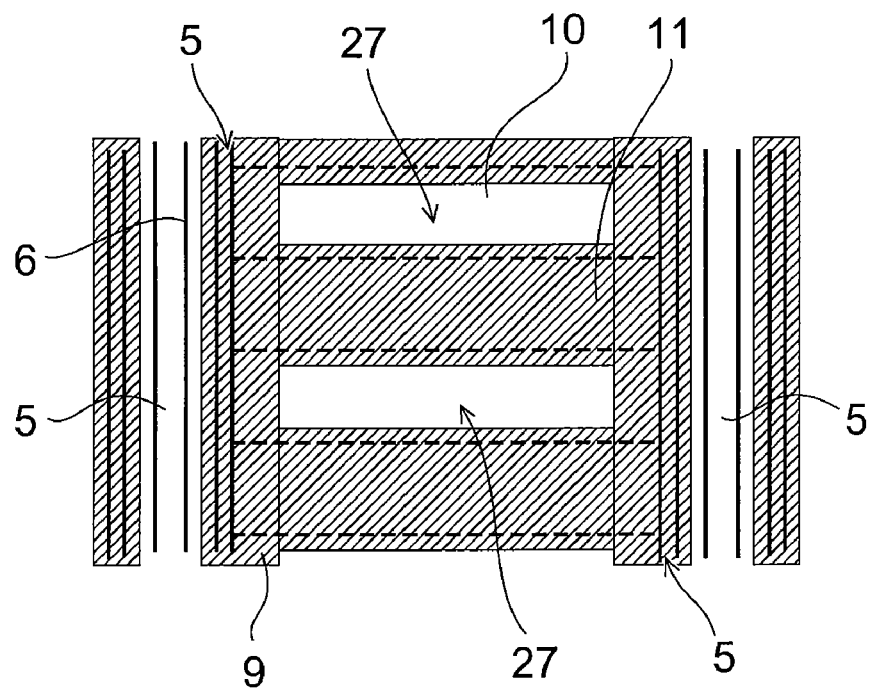
FIG. 24 is a plan view schematically illustrating the gate electrode provided on the surface n-pillar layers and the surface p-pillar layers of the power semiconductor device according to a eighth embodiment of this invention.

FIG. 24 is a plan view schematically illustrating the gate electrode 9 provided on the surface n-pillar layers 11 and the surface p-pillar layers 10.

As illustrated in FIG. 24, the gate electrode 9 has a step-like plane shape having openings 27. The gate electrode 9 is provided between the adjacent p-base layers 5 with the openings 27 located on the surface p-pillar layers 10.

For example, in the embodiments illustrated in FIGS. 1 to 4 and 18, the effect of decreasing the ON resistance is obtained. However, when the gate-drain capacitance Cgd increases corresponding to an area of the gate electrode 9, the switching loss often increases. Then, as illustrated in FIG. 24, the openings 27 of the gate electrodes 9 are provided on the surface p-pillar layers 10, whereby Cgd can be decreased.

On the other hand, the gate electrode 9 is provided on the surface n-pillar layers 11, whereby, as described above, storage channels are formed between the gate insulation film 8 and the surface n-pillar layers 11. Thus, while maintaining the effect of decreasing the ON resistance, Cgd can be made small.

Figure 25:
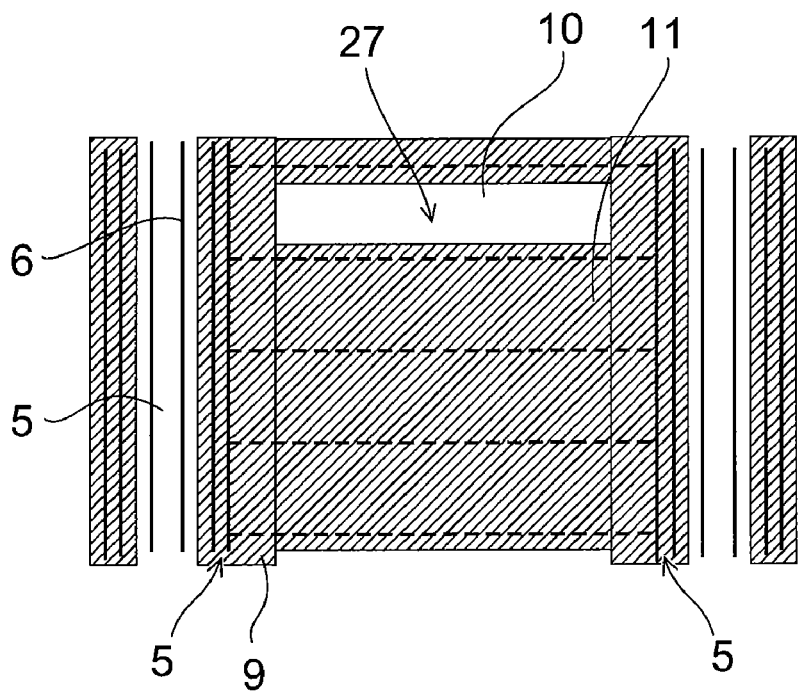
FIG. 25 is a plan view schematically illustrating the gate electrode provided on the surface n-pillar layers and the surface p-pillar layers of the power semiconductor device according to a variation of the eighth embodiment of this invention.

FIG. 25 is a plan view schematically illustrating the gate electrode 9 provided on the surface n-pillar layer 11 and the surface p-pillar layer 10 of the power MOSFET according to a variation of this embodiment. In the variation illustrated in FIG. 25, the opening 27 is provided on a part of the surface p-pillar layer 10. In the embodiment illustrated in FIG. 24, the openings 27 of the gate electrode 9 are provide on all the surface p-pillar layers 10. In contrast to this, as illustrated in FIG. 25, the number of the openings provided on the surface p-pillar layers is varied, whereby the value of Cgd can be adjusted.

A Ninth Embodiment

Figure 26:
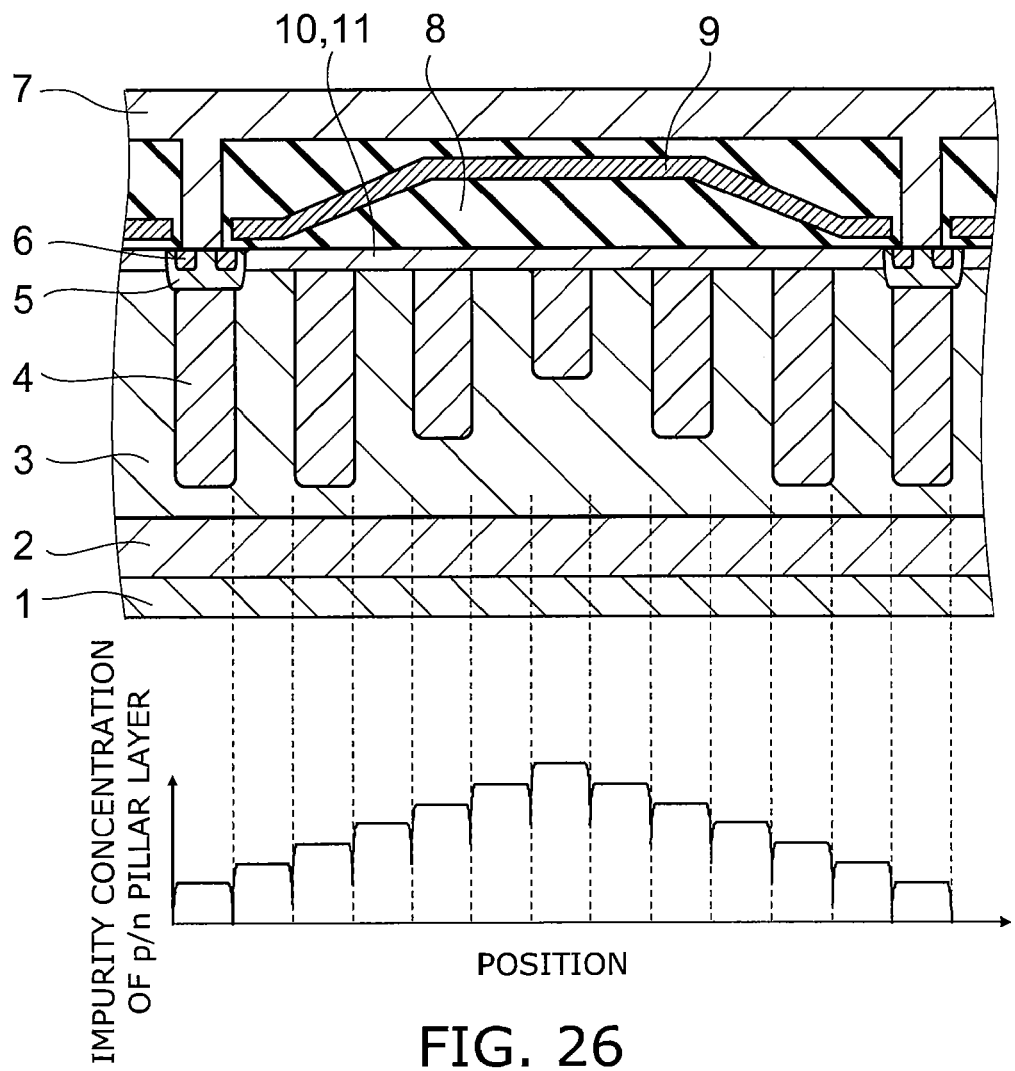
FIG. 26 is a cross-sectional view of the unit cell of the power semiconductor device according to a ninth embodiment of this invention, and the impurity concentration distribution of the respective pillar layers.

FIG. 26 is a cross-sectional view schematically illustrating the configuration of the power MOSFET according to a ninth embodiment. The power MOSFET according to this embodiment has the same terrace gate structure as the power MOSFET illustrated in FIG. 8 and includes a number of the p-pillar layers 4 and the n-pillar layers 3 between two p-base layers 5. According to this embodiment, below the middle portion of the gate electrode 9 provided between two p-base layers 5, the space between the drain layer 2 and the ends of the p-pillar layers 4 connected to the surface p-pillar layers 10, which are on the side of the drain layer 2 is larger than the space between the drain layer 2 and the ends of the p-pillar layers 4 provided below the p-base layers 5, which are on the side of the drain layer 2. That is, the depth of the p-pillar layers 4 from the surface p-pillar layers 10 toward the drain layer 2 is smaller.

By using the terrace gate structure illustrated in FIG. 26, the voltage retained by the gate insulation film 8 can be increased in the middle portion of the gate electrode 9, where the gate insulation film 8 is thick. Resultantly, the voltage to be retained by the SJ structure can be made relatively small, and the thickness of the SJ structure can be made small. That is, as illustrated in FIG. 26, the p-pillar layers 4 can be provided shallow. Thus, the same effect can be obtained as by making the thickness of the drift layer thinner in the middle portion of the gate electrode 9, so as to reduce the ON. As illustrated in FIG. 26, this may be combined with the concentration variation of the impurity concentrations of the p-pillar layers 4 and the n-pillar layers 3, which increases from the side of the p-base layers 5 toward the middle portion of the gate electrode 9, whereby the ON resistance can be further decreased.

Figure 27:
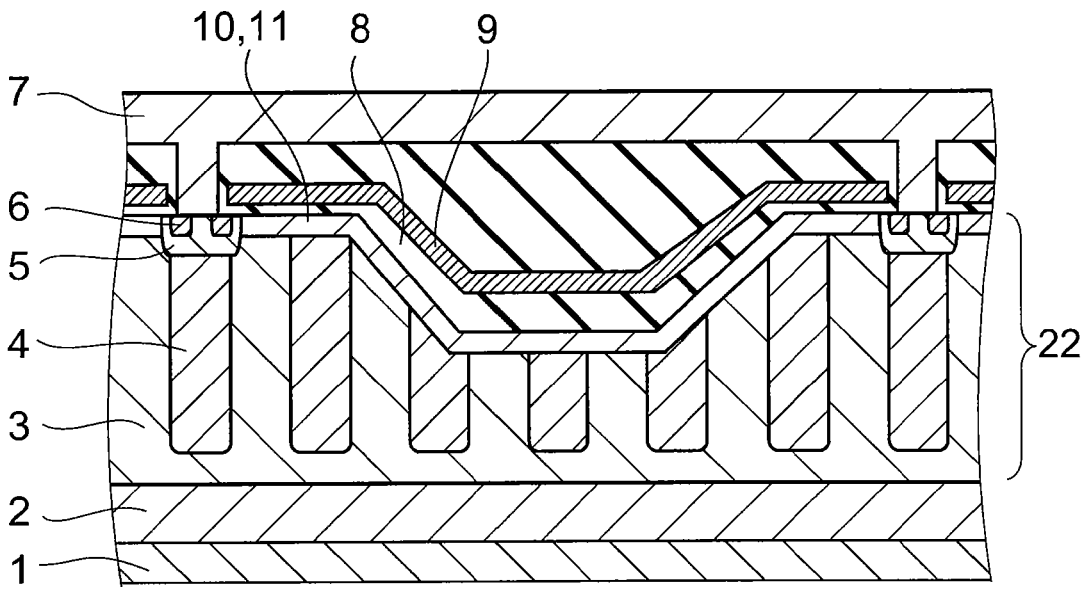
FIG. 27 is a cross-sectional view of the unit cell of the power semiconductor device according to a variation of the ninth embodiment of this invention.

FIG. 27 is a cross-sectional view schematically illustrating the configuration of the power MOSFET according to a variation of this embodiment. In this variation, below the middle part of the gate electrode 9 provide between two p-base layers 5, the super junction layer 22 is recessed from the surface. That is, the thickness from the interface between the surface p-pillar layer 10 and the gate insulation film 8 to the drain layer 2 is made thinner than the thickness from the surfaces of the p-base layers 5 to the drain layer 2, whereby the ON resistance can be decreased.

On the other hand, the gate insulation film 8 is provided thicker in the middle portion of the gate electrode 9 than on the p-base layers 5. Accordingly, the decrease of the breakdown voltage caused by the thinned SJ structure can be compensated, whereby the ON resistance can be decreased without lowering the breakdown voltage.

So far, the first to the fifth embodiments of this invention have been described, but this invention is not limited to the above-described embodiments. For example, in the description, the first conduction type is N-type, and the second conduction type is P-type, but this invention can be embodied even with the first conduction type being P-type and the second conduction type being N-type.

For example, the process for forming the super junction structure is not limited to the process described above; this invention can be embodied by various processes, such as the process of forming trenches and then making buried growth, the process of forming trenches and then implanting ions in the side walls or others, other than the process of repeating ion implantation and epitaxial growth plural times.

The p-pillar layers 4 are not in contact with the $n^+$ drain layers, but this invention can be embodied even with the p-pillar layers 4 being in contact with the $n^+$ drain layer 2. Furthermore, this invention can be embodied even with an n-layer whose concentration is lower than the n-pillar layers 3 formed between the p-pillar layers 4 and the $n^+$ drain layer 2.

The MOSFET using silicon (Si) as the semiconductor material has been described, but, for example, compound semiconductors, such as silicon carbide (SiC), gallium nitride (GaN), etc., and wide band gap semiconductors, such as diamond, etc., can be used. Other than the MOSFET of the super junction structure, hybrid devices of MOSFET and SBD, devices, such as IGBT, etc., are applicable.

The invention claimed is:

1. A power semiconductor device comprising:
a first semiconductor layer of a first conduction type;
second semiconductor layers of the first conduction type and third semiconductor layers of a second conduction type alternately provided transversely on the first semiconductor layer;
fourth semiconductor layers of the second conduction type provided on the surfaces of the third semiconductor layers;
fifth semiconductor layers of the first conduction type provided selectively on the surfaces of the fourth semiconductor layer;
sixth semiconductor layers of the second conduction type and seventh semiconductor layers of the first conduction type alternately provided transversely on the second and the third semiconductor layers;
a first main electrode electrically connected to the first semiconductor layer;
an insulation film provided on the fourth semiconductor layers, the sixth semiconductor layers and the seventh semiconductor layers;
a control electrode provided on the fourth semiconductor layers, the sixth semiconductor layers and the seventh semiconductor layers via the insulation film; and
a second main electrode joined to the surfaces of the fourth semiconductor layers and the fifth semiconductor layers,
the sixth semiconductor layers being connected to the fourth semiconductor layers and to at least one of the third semiconductor layers, which is provided between two of the fourth semiconductor layers, and
an impurity concentration of the third semiconductor layers provided below the sixth semiconductor layers being higher than an impurity concentration of the third semiconductor layers provided under the fourth semiconductor layers.

2. The device according to claim 1, wherein
the insulation film on the third semiconductor layers provided below the sixth semiconductor layers is thicker than the insulation film on the fourth semiconductor layers.

3. The device according to claim 1, wherein
immediately below the middle portion of the control electrode provided between two of the fourth semiconductor layers, an impurity concentration of the seventh semiconductor layers is higher than an impurity concentration of the sixth semiconductor layers.

4. The device according to claim 1, wherein
an unit width of the periodic arrangement of the sixth semiconductor layers and the seventh semiconductor layers alternately provided is smaller than an unit width of the periodic arrangement of the second semiconductor layers and the third semiconductor layers alternately provided.

5. The device according to claim 1, wherein
an impurity concentration of the third semiconductor layers
is higher on the side of the second main electrode than an impurity concentration of the adjacent second semiconductor layers, and
is lower on the side of the first main electrode than an impurity concentration of the adjacent second semiconductor layers.

6. The device according to claim 5, wherein
a difference between the impurity concentration of the third semiconductor layers and the impurity concentration of the adjacent second semiconductor layers below the fourth semiconductor layers is larger than a difference below the sixth semiconductor layers.

7. The device according to claim 1, comprising
eighth semiconductor layers of the second conduction-type provided selectively on the surfaces of the third semiconductor layers and electrically connected to the second main electrode,
a depth of the eighth semiconductor layers from the surfaces contacting the second main electrode toward the first semiconductor layer is larger than a depth of the fourth semiconductor layers from the surfaces contacting the second main electrode toward the first semiconductor layer.

8. The device according to claim 7, further comprising
a device region where the fourth semiconductor layers are provided, and a terminal region provided in the end of the device region,
the eighth semiconductor layer being provided in the end of the device region.

9. The device according to claim 7, wherein
an impurity concentration of the third semiconductor layers provided below the eighth semiconductor layers is higher than an impurity concentration of the third semiconductor layers provided below the fourth semiconductor layers.

10. The device according to claim 1, wherein
the second semiconductor layer or the third semiconductor layer having the highest impurity concentration among a plurality of the second semiconductor layers and a plurality of the third semiconductor layers provided between two of the fourth semiconductor layers is disposed at the middle between the two fourth semiconductor layers, and
an impurity concentration of the second semiconductor layers and the third semiconductor layers provided between the second semiconductor layer or the third semiconductor layer having the highest impurity concentration and the third semiconductor layers provided below the fourth semiconductor layers has the intermediate value of impurity concentrations of the second semiconductor layers or the third semiconductor layers adjacent thereto on the respective both sides.

11. The device according to claim 1 further comprising
a device region where the fourth semiconductor layers are provided, and a terminal region provided in the end of the device region,
and a ninth semiconductor layer of the first conduction type of a lower impurity concentration than the second semiconductor layers being provided in the border between the device region and the terminal region, the ninth semiconductor layer being provided from a surface of the terminal region to the first semiconductor layer.

12. The device according to claim 11, wherein
at least one or more tenth semiconductor layer is provided on the surface of the ninth semiconductor layer.

13. The device according to claim 1, wherein
the fourth semiconductor layers, the sixth semiconductor layers, the seventh semiconductor layers and the control electrodes are provided in stripes, and
the fourth semiconductor layers and the seventh semiconductor layers are orthogonal to each other.

14. The device according to claim 13, wherein
the third semiconductor layers are provided in stripes parallel with the fourth semiconductor layers.

15. The device according to claim 13, wherein
the second semiconductor layers are provided in a mesh or an offset mesh.

16. The device according to claim 1, wherein
the third semiconductor layers and the fourth semiconductor layers are provided in dots disposed in a matrix arrangement or in dots disposed in a zigzag arrangement having the phase shifted among the columns.

17. The device according to claim 1, wherein
the sixth semiconductor layer is provided to connect the third semiconductor layer and one of a plurality of the fourth semiconductor layers, the third semiconductor layer being disposed between the fourth semiconductor layers provided apart from each other, the one of plurality of the fourth semiconductor layers being disposed in a location closest to the third semiconductor layer.

18. The device according to claim 1, wherein
the control electrode has an opening on the sixth semiconductor layer.

19. The device according to claim 1, wherein
below the middle portion of the control electrode provided between two of the fourth semiconductor layers, an distance between the first semiconductor layer and the end portion of the third semiconductor layer connected to the sixth semiconductor layer is larger than an distance between the first semiconductor layer and the end portion of the third semiconductor layers provided below the fourth semiconductor layer.

20. The device according to claim 1, wherein
below the middle portion of the control electrode provided between two of the fourth semiconductor layers, a thickness from the interface between the sixth semiconductor layers and the insulation film to the first semiconductor layer is smaller than a thickness from the surface of the fourth semiconductor layers to the first semiconductor layer, the fourth semiconductor layer being connected to the second main electrode.

* * * * *